(12) United States Patent
Nagaoka

(10) Patent No.: US 6,288,962 B1
(45) Date of Patent: Sep. 11, 2001

(54) SEMICONDUCTOR DEVICE ALLOWING FAST SIGNAL TRANSFER AND SYSTEM EMPLOYING THE SAME

(75) Inventor: Hideaki Nagaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/606,186

(22) Filed: Jun. 29, 2000

(30) Foreign Application Priority Data

Dec. 22, 1999 (JP) ................................................ 11-364450

(51) Int. Cl.$^7$ ....................................................... G11C 7/02
(52) U.S. Cl. ............................................. 365/210; 365/181
(58) Field of Search ..................................... 365/210, 181

(56) References Cited

U.S. PATENT DOCUMENTS 5,703,821 * 12/1997 Baroni et al. ......................... 365/210

FOREIGN PATENT DOCUMENTS 4-81019    3/1992  (JP) .

* cited by examiner

Primary Examiner—David Nelms
Assistant Examiner—M. Tran
(74) Attorney, Agent, or Firm—McDermott, Will & Emery

(57) ABSTRACT

A pair of dummy signal lines transmitting dummy signals, complementary to and synchronized with a normal signal, are arranged to form a set together with a normal transfer line transmitting the normal signal. In a device on a receiving side, one of the dummy signal lines is selected and coupled in accordance with the logic level of the normal signal, whereby two ringings occur in the opposite phases on the receiving side, and cancel each other so that ringing of the normal signal can be suppressed. An input/output interface, which can transfer a signal having a short level transition time without causing ringing, can be provided.

20 Claims, 16 Drawing Sheets

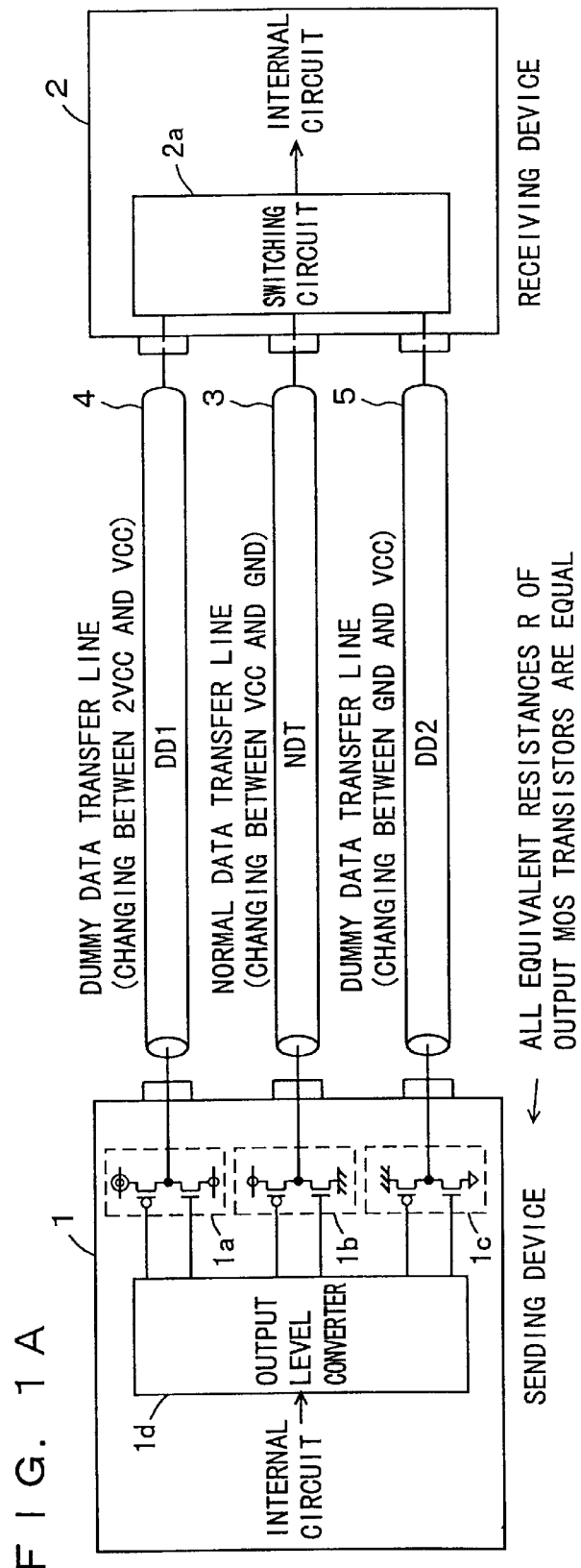
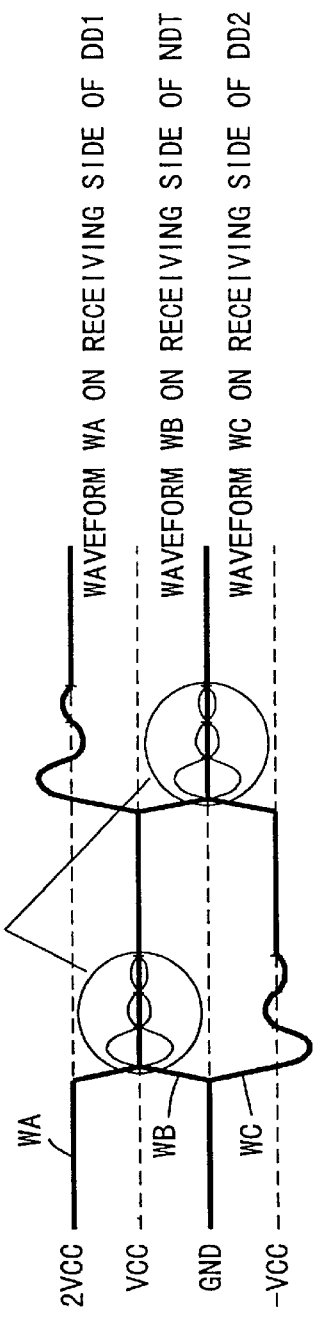

F I G. 2 3 PRIOR ART
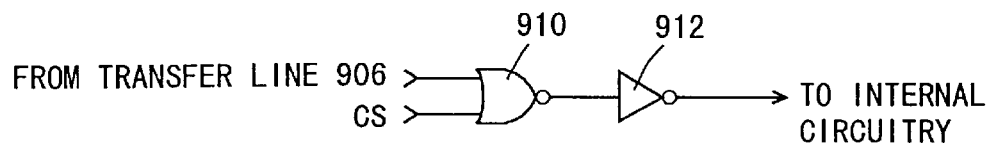
F I G. 2 4 PRIOR ART
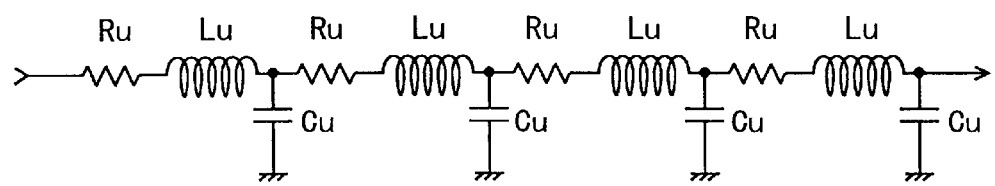
F I G. 2 5 PRIOR ART
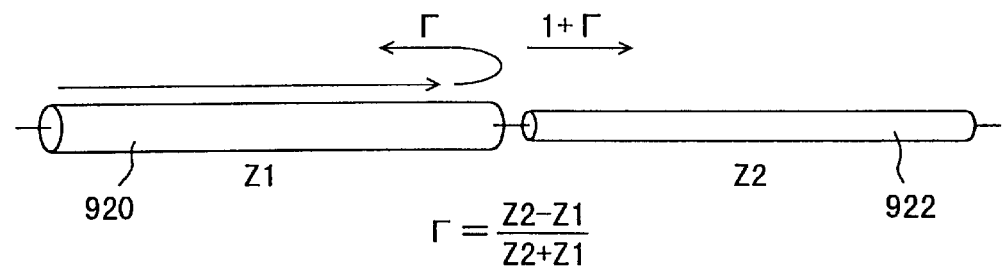
F I G. 2 6 PRIOR ART
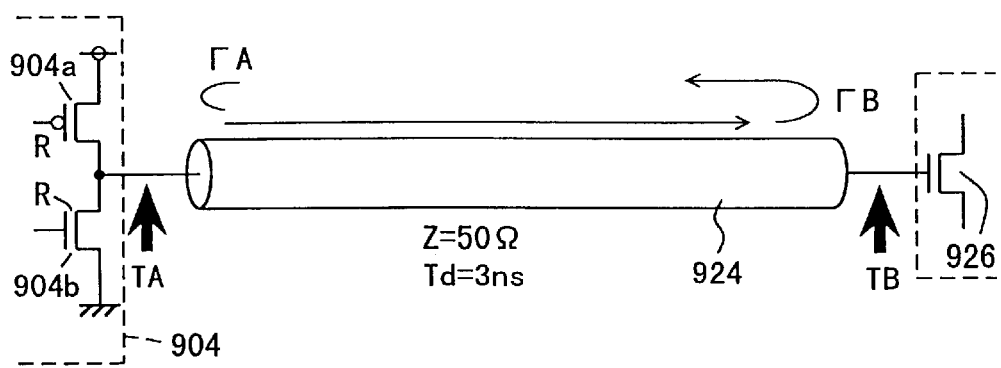

SEMICONDUCTOR DEVICE ALLOWING FAST SIGNAL TRANSFER AND SYSTEM EMPLOYING THE SAME

BACKGROUND OF THE INVENTION

1. Field of the Invention

The present invention relates to a semiconductor device and a system using the same, and particularly, relates to a structure of an input/output interface of a semiconductor device for forming a high speed system. More particularly, the invention relates to a structure of an interface which does not cause ringing even if a signal level transition time is reduced.

2. Description of the Background Art

FIG. 21 schematically shows an example of a structure of a data processing system in the prior art. In FIG. 21, a processing unit (CPU) PC and a plurality of memory devices M1–Mn are commonly connected to a data bus DB. Processing unit (CPU) accesses memory devices M1–Mn via data bus DB. In recent years, the data transfer speed of memory devices M1–Mn has been increased in accordance with increase in internal operation speed of processing unit (CPU) PC.

FIG. 22 shows an example of a structure of a data output portion of one bit in memory devices M1–Mn. In FIG. 22, a data output circuit includes a logic determining portion 900 receiving an output enable signal OE and an internal data signal DATA, to determine a logic level of output data, a timing adjusting portion 902 for adjusting timing of the output signal of logic determining portion 900, and an output portion (driver) 904 for driving a transfer line 906 in accordance with the output signal of timing adjusting portion 902.

Logic determining portion 900 includes an inverter 900a inverting output enable signal OE, an NAND circuit 900b receiving output enable signal OE and internal data DATA, and an NOR circuit 900c receiving the output signal of inverter 900a and internal data DATA.

In a general memory system, as shown in FIG. 21, a plurality of memory devices M1–Mn are coupled to data bus DB. Therefore, output enable signal OE is used for preventing conflict between data on data bus DB (data transfer line 906). In this logic determining portion 900, when output enable signal OE is at L-level, the output signal of NAND circuit 900b is at H-level, and the output signal of NOR circuit 900c is at L-level so that transfer of internal data DATA is not performed. When output enable signal OE attains H-level, NAND circuit 900b and NOR circuit 900c operate as inverters, each of which inverts internal data DATA and applies the inverted data to timing adjusting portion 902 in the next stage.

Output driver 904 includes a P-channel MOS transistor (insulated gate field effect transistor) 904a and an N-channel MOS transistor 904b.

Timing adjusting portion 902 includes a first timing adjusting circuit 902a for adjusting the timing of the output signal of NAND circuit 900b, to apply a drive signal to a gate of P-channel MOS transistor 904a of output driver 904, and a second timing adjusting circuit 902b receiving the output signal of NOR circuit 900c, for adjusting timing thereof to apply the timing-adjusted signal to a gate of N-channel MOS transistor 904b of output driver 904. Timing adjusting portion 902 adjusts the timing of the signals applied from logic determining portion 900 for avoiding such a situation that both MOS transistors 904a and 904b of output driver 904 are simultaneously turned on to cause flow of a through-current. More specifically, first timing adjusting circuit 902a adjusts a waveform of its output signal such that the rising of the output signal may be sharp for achieving faster turn-off of MOS transistor 904a of output driver 904, while the falling of the output signal may be slowed. Second timing adjusting circuit 902b likewise adjusts the timing so as to make the falling of its output signal sharp for achieving faster turn-off of MOS transistor 904b of output driver 904, and to slow down the rising of the output signal. Thereby, the MOS transistors in output driver 904 to be turned off rapidly attain the off state, and paths of a through-current are rapidly cut off for preventing occurrence of the through-current.

When output enable signal OE is at L-level, the output signal of NAND circuit 900b is at H-level, and the output signal of NOR circuit 900c is at L-level. In output driver 904, both MOS transistors 904a and 904b are off, and the output circuit is at an output high impedance state. Thus, this data output circuit is a tristate output circuit.

FIG. 23 shows an example of a structure of an input portion for one-bit data. In FIG. 23, the input circuit includes an NOR circuit 910 which receives write data sent through transfer line 906 and a chip select signal CS, and an inverter 912 which inverts and transmits the output signal of NOR circuit 910 to an internal circuit. Chip select signal CS designates that the memory device is selected and has to be received write data. By applying chip select signal CS to NOR circuit 910, it is determined whether the input signal is to be activated or not. Further, the level for determining the logic level applied through transfer line 906 is adjusted by adjusting the input logic threshold voltage. Inverter 912 in the next stage adjusts delay of rising and falling of the write data applied from NOR circuit 910. NOR circuit 910 is formed of MOS transistors, which receive on their respective gates the signal sent through transfer line 906 and chip select signal CS. The gate of each MOS transistor is electrically isolated from other internal nodes by a gate insulating film. Therefore, transfer line 906 is not electrically terminated, and is electrically floated.

In the data processing system, memory devices are arranged on a board, and are connected together via on-board interconnection lines. Data bus DB shown in FIG. 21 is on-board interconnection lines, and other control signals, a clock signal or the like are transmitted via on-board interconnection lines. The on-board interconnection line is greater in line width than internal interconnection lines of the memory devices, and has a relatively large parasitic impedance and a relatively large parasitic capacitance (e.g., parasitic capacitance with respect to the board).

FIG. 24 schematically shows a distribution of parasitic impedances on the transfer line. In FIG. 24, the transfer line has a parasitic resistance Ru per unit length, an inductance Lu per unit length and a parasitic capacitance Cu per unit length. Parasitic resistance Ru and inductance Lu are connected in series. Parasitic capacitance Cu is connected between the transfer line and a ground node (board). In the case where the impedances are distributed on the transfer line as described above, a characteristic impedance Z can be represented by the following formula, assuming that resistance value R can be neglected.

$$Z = \sqrt{(Lu \cdot Cu)}$$

A propagation delay time tpdu per unit length of the transfer line having the characteristic impedance Z is expressed by the following formula:

$$tpdu = \sqrt{(Lu \cdot Cu)}$$

The output circuit shown in FIG. 22 must perform fast transfer of data via the transfer line having characteristic impedance Z. By increasing the size (ratio of gate width to gate length) of MOS transistors 904a and 904b included in output driver 904 shown in FIG. 22, or by reducing the equivalent resistances (channel resistances in the on-state) of the MOS transistors, the level transition time of the transfer signal becomes short, and the data transfer speed can be increased. However, if such fast data transfer is performed, the parasitic inductance and parasitic capacitance of the transfer line would cause signal reflection on the end, i.e., on the data input side to cause ringing if the equivalent resistances of MOS transistors 904a and 904b of the output driver are not matched with the impedance of the transfer line.

FIG. 25 shows a reflection coefficient and transmission coefficient of the transfer line. In FIG. 25, a transfer line 920 having a characteristic impedance Z1 is connected to a transfer line 922 having a characteristic impedance Z2. FIG. 25 shows a case where a signal is transferred from transfer line 920 to transfer line 922. A reflection coefficient $\Gamma$ between transfer lines 920 and 922 can be expressed by the following formula:

$$\Gamma = (Z2-Z1)/(Z2+Z1)$$

The transmission coefficient is given by $(1+\Gamma)$. The signal having an amplitude equal to a product of the signal amplitude and the reflection coefficient $\Gamma$ is reflected on a boundary between transfer lines 920 and 922. If the reflection coefficient $\Gamma$ is positive, reflection occurs in the same phase. If the reflection coefficient $\Gamma$ is negative, reflection occurs in the opposite phase.

Description will now be given on the case shown in FIG. 26. As shown in FIG. 26, the signal sent from output driver 904 shown in FIG. 22 is transferred via a transfer line 924 with characteristic impedance Z of 50Ω and a whole signal propagation delay time Td of 3 ns. Each of MOS transistors 904a and 904b included in output driver 904 has an equivalent resistance (channel resistance in the on-state) of R. Transfer line 924 is connected to a gate of a MOS transistor 926 on an initial input stage on the signal receiving side. Input MOS transistor 926 has an infinite input impedance. A reflection coefficient $\Gamma A$ on output stage TA is expressed by the following formula:

$$\Gamma A = (R-Z)/(R+Z)$$

A reflection coefficient $\Gamma B$ on a signal receiving end TB of transfer line 924 is expressed by the following formula:

$$\Gamma B = (\infty-Z)/(\infty+Z) = 1$$

FIGS. 27 and 28 show signal waveforms on sending end TA and receiving end TB of the signal transfer line shown in FIG. 26, respectively. FIG. 27 shows the signal waveforms on signal sending end TA and signal receiving end TB under the conditions of R<Z. In the signal output operation, the potential on signal sending end TA attains the level determined by resistance division by equivalent resistance R of MOS transistor 904a and characteristic impedance Z of transfer line 924. This potential on the sending end TA is transferred onto transfer line 924, and reaches data receiving end TB upon elapsing of propagation time Td. On data receiving end TB, reflection occurs with reflection coefficient $\Gamma B$ of 1, and the signal amplitude is doubled. The reflected wave reaches data sending end TA upon elapsing of propagation time Td, and reflection occurs with reflection coefficient of $\Gamma A$. The amplitude of this reflected wave decreases (reflection in the opposite phase). This reflected wave reaches signal receiving end TB again upon elapsing of propagation time Td. The width of lowering is doubled by the total reflection signal, and the signal is transferred to signal sending end TA again. Thereafter, the above operations are repeated.

Accordingly, if characteristic impedance Z is larger than equivalent resistance R of MOS transistor 904a, ringing occurs on signal receiving end TB. When this ringing changes exceeding a minimum level VIHmin for determining the H-level, the logic level of the signal cannot be accurately determined on the signal receiving side, and the determination of the input signal logic level must be delayed until the ringing is settled. Similar ringing occurs at the time of rising of the signal.

Accordingly, large ringing occurs on the side of the receiving end if output MOS transistors 904a and 904b in output driver 904 have reduced equivalent resistances R for driving transfer line 924 with a large current driving capability. When MOS transistor 904b in output driver 904 is turned on, ringing likewise occurs due to undershoot which in turn lowers beyond the ground voltage level.

FIG. 28 shows signal waveforms on signal transmission end TA and signal receiving end TB in the case where equivalent resistances R of output MOS transistors 904a and 904b of output driver 904 are greater than characteristic impedance Z of signal transfer line 927. A relationship between the signal sending and receiving systems is the same as that shown in FIG. 26. As shown in FIG. 28, if equivalent resistance R is greater than characteristic impedance Z, a signal at the potential level determined by resistance division by equivalent resistance R and characteristic impedance Z is generated on signal sending end TA. The potential at the end TA is transmitted to signal receiving end TB, and is reflected with reflection coefficient $\Gamma B$ of 1, so that the signal amplitude is doubled. This reflected amplitude is transmitted to signal sending end TA again upon elapsing of time Td, and is reflected again with reflection coefficient $\Gamma A$. Since reflection coefficient $\Gamma A$ is positive, reflection in the same phase occurs so that the signal voltage level rises on signal sending end TA. Thereafter, the reflection is repeated so that the signal voltage level gradually rises on signal receiving end TB. In the case shown in FIG. 28, ringing does not occur, and the voltage level of the input signal on signal receiving end TB gradually rises. However, equivalent resistance R is large and the current drive capability of output driver 904a is small (size is small), resulting in a problem that fast driving of transfer line 924 and therefore fast signal transfer are impossible.

As described above, if equivalent resistances R of MOS transistors 904a and 904b included in output driver 904 are increased for preventing occurrence of ringing, the signal level transition time increases so that it is impossible to increase the signal transfer rate via transfer line 906, and a high speed processing system cannot be achieved.

For preventing ringing on data receiving end TB of the transfer line, equivalent resistance R should be matched with characteristic impedance Z of transfer line 924 (R=Z), to set reflection coefficient $\Gamma A$ on data sending end TB of the transfer line to 0 and to set reflection coefficient $\Gamma B$ on data receiving end TB of the transfer line to 1. However, if such impedance matching is achieved, equivalent resistances R of output MOS transistors 904a and 904b increase, and the current drive capabilities of MOS transistors 904a and 904b decrease so that it is impossible to send a signal with steep rising and falling. Accordingly, it is necessary to send and receive a signal which rises and falls slowly, as shown in FIG. 29. Therefore, it is necessary to delay the logic determination of the input signal for time td, so that fast transfer of data/signal cannot be achieved. Thus, the level transition time of the data/signal is long so that the signal/data transfer rate on the transfer line cannot be increased.

For overcoming the above problems, several kinds of fast input/output interfaces have been proposed. However, they have not yet overcome the problems fundamentally.

FIG. 30A schematically shows a structure of a fast I/O (input/output) interface in the prior art. In FIG. 30A, a device 930 on a sending side and a device 940 on a receiving side are coupled via transfer lines 932 and 934 transferring complementary signals. The signals transferred through transfer lines 932 and 934 change between a power supply voltage VCC and a ground voltage GND.

Sending device 930 includes an output logic converter 930a for converting a logic level of a signal applied from an internal circuit to produce complementary signals, an output drive circuit 930b for driving transfer line 932 in accordance with the output signal of output logic converter 930a, and an output drive circuit 930c for driving transfer line 934 in accordance with the output signal of output logic converter 930a. Output drive circuits 930b and 930c transmit complementary signals onto transfer lines 932 and 934.

Receiving device 940 includes a differential sense circuit 940a for differentially amplifying the complementary signals transferred via transfer lines 932 and 934, to determine the logic level for generating a signal onto an internal circuit.

Complementary signals are transferred via transfer lines 932 and 934, and the complementary signals are differentially sensed by differential sense circuit 940a in receiving device 940, whereby signals of a small amplitude can be transmitted, and fast signal transfer can be rachieved.

Even in the structure of the above fast I/O interface, however, ringing occurs on the input portion of the receiving device if impedance matching is not achieved. Therefore, if the ringing occurs in the input stage of differential sense circuit 940a, and the logic levels of the complementary signals are inverted as shown in FIG. 30B, an error may occur in determination of the logic level of the input signal in differential sense circuit 940a, and an erroneous internal signal may be produced. Accordingly, in the fast I/O interface described above, the determination of the logic level must be performed after the ringing is sufficiently damped and a stable state is attained. Therefore, it is difficult to ensure fast I/O interface.

The foregoing problems related to the ringing arise not only in general memory systems and data processing systems but also in systems performing fast transfer of signals. In the memory devices, problems of ringing data may be caused by transfer of clock signals, control signal, address signals or the like, as in data transfer.

SUMMARY OF THE INVENTION

An object of the invention is to provide a semiconductor device with an input/output interface that does not cause ringing even if a level transition time of a transmission signal is reduced, as well as a system employing such a semiconductor device.

Another object of the invention is to provide a semiconductor device with an input/output interface circuit that can perform fast signal transfer with a simple circuit structure, and that can achieve a system capable of fast operation.

In summary, according to the invention, a normal signal line for transferring a transmission signal, and a set of first and second dummy signal lines having the same signal transmission characteristics as the normal signal line, for transmitting signals complementary to the normal signal are arranged for one transmission signal.

Transfer lines have equal ringing characteristics, if they are equal in length and electric characteristics or equal in signal transmission characteristics, so that they are equal in reflection coefficient and signal propagation delay time. For utilizing these characteristics, the first and second dummy signal lines are arranged in parallel with each other for transmitting the signals complementary to a digital signal to be sent. In a device on a signal receiving side, the first and second dummy signal lines are selectively and electrically coupled to the normal signal line so that ringing in one direction can be cancelled by ringing in the opposite direction, and unnecessary ringing of the digital signal can be cancelled. Thereby, occurrence of ringing can be suppressed, and fast signal transfer can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A schematically shows a structure of an input/output interface circuit according to a first embodiment of the invention, and FIG. 1B is a signal waveform diagram representing an operation of the structure shown in FIG. 1A;

FIG. 23 schematically shows a structure of an input portion of the memory device shown in FIG. 21;

FIG. 24 schematically shows an impedance distribution on a data transfer line;

FIG. 25 illustrates signal reflection of the transfer line;

FIG. 26 specifically illustrates signal reflection of the transfer line between devices;

DESCRIPTION OF THE PREFERRED EMBODIMENTS

First Embodiment

Figure 2A:
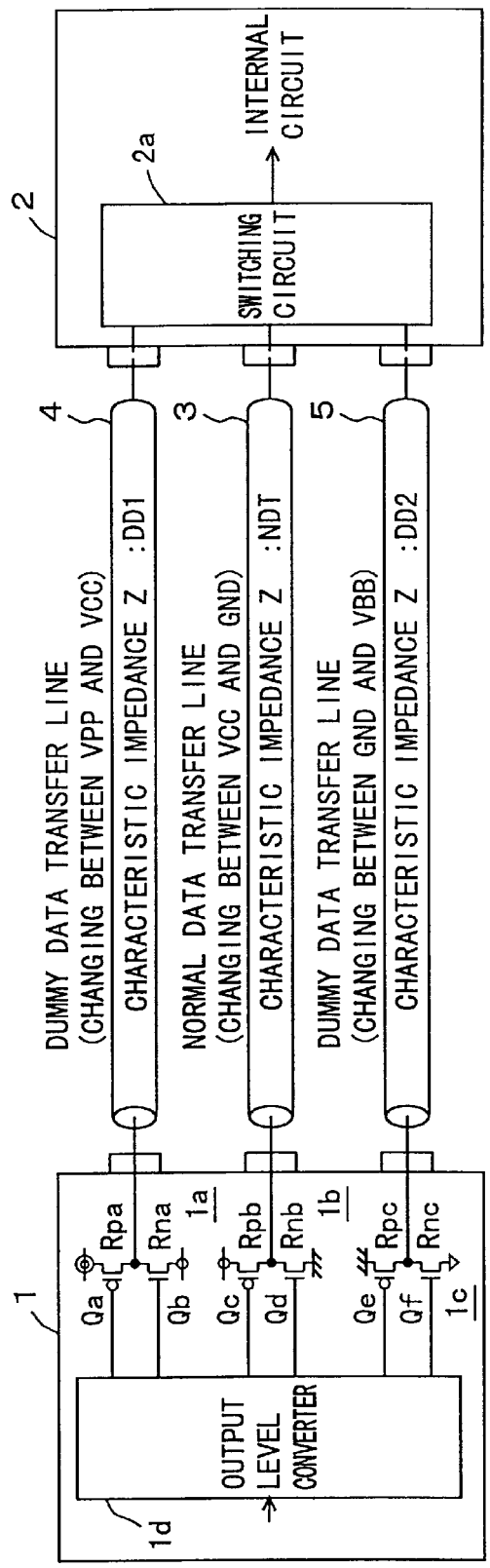
FIG. 2A schematically shows a structure of an input/output interface circuit according to a second embodiment of the invention.

FIG. 1A schematically shows a system structure of a semiconductor device with an input/output interface circuit according to the first embodiment of the invention. In FIG. 1A, a normal data transfer line 3 transmitting normal data NDT is arranged between a device 1 on a sending side and a device 2 on a receiving side. Also, a dummy data transfer line 4 transferring first dummy data DD1 changing complementarily to normal data NDT, and a dummy data transfer line 5 transferring second dummy data DD2 changing complementarily to normal data NDT are arranged between receiving device 1 and sending device 2. Normal data NDT changes between power supply voltage VCC and ground voltage GND, and first dummy data DD1 changes between a high voltage VPP (=2·VCC) and power supply voltage VCC. Second dummy data DD2 changes between ground voltage GND and a negative voltage VBB (=−VCC). Therefore, normal data NDT and dummy data DD1 and DD2 have equal amplitudes of VCC. In the following description, data is taken as an example of a transfer signal. However, the transfer signal may be a clock signal CLK determining operation timing or various kinds of control signals other than data.

Sending device 1 includes an output driver 1a for driving dummy data transfer line 4, a normal output driver 1b for driving normal data transfer line 3, a dummy output driver 1c driving dummy data transfer line 5 and an output level converter 1d for driving output drivers 1a–1c in accordance with internal signals received applied from internal circuitry. Output level converter 1d receives internal data (and timing signals) from internal circuitry, and converts the levels of the received signal for applying to dummy output drivers 1a and 1c, dummy signals changing complementalily to and in synchronization with the signal applied to normal output driver 1b. Accordingly, dummy data transfer lines 4 and 5 are supplied with dummy data DD1 and DD2 that change complementarily to and in synchronization with normal data NDT transmitted via normal data transfer line 3. The dummy data transfer lines 4 and 5 as well as normal data transfer line 3 are equal in transfer line condition (signal transmission condition) such as line length, signal propagation time and transfer signal amplitude, and therefore have equal ringing characteristics.

Receiving device 2 includes a switching circuit 2a coupled to normal data transfer line 3 for connecting normal data transfer line 3 selectively to dummy data transfer lines 4 and 5. Switching circuit 2a isolates dummy data transfer line 4 from normal data transfer line 3, and electrically connects normal data transfer line 3 to dummy data transfer line 5 when normal data NDT falls from power supply voltage VCC level to ground voltage GND level. When normal data NDT rises from ground voltage GND level to power supply voltage VCC level, switching circuit 2a isolates dummy data transfer line 5 from normal data transfer line 3, and electrically connects normal data transfer line 3 to dummy data transfer line 4. Accordingly, dummy data transfer lines 4 and 5 are complementalily and electrically connected to normal data transfer line 3 by switching circuit 2a.

FIG. 1B shows input signal waveforms of receiving device 2. WA, WB and WC indicate reception waveforms of dummy data DD1, normal data NDT and dummy data DD2, respectively.

As already described, all data transfer lines 3–5 have equal signal transmission characteristics and therefore equal ringing characteristics. Accordingly, switching circuit 2a in receiving device 2 can be used to couple electrically and selectively dummy data transfer lines 4 and 5 to normal data transfer line 3 so as to cancel ringing, whereby ringing can be cancelled even in the case of a data signal waveform having a short level transition time.

As shown in FIG. 1B, when normal data NDT level rises from ground voltage GND to power supply voltage VCC level, normal data transfer line 3 is electrically coupled to dummy data transfer line 4, and is electrically isolated from dummy data transfer line 5. Dummy data DD1 is a data signal complementary to normal data NDT transmitted on normal data transfer line 3, and therefore ringings occur in the opposite phases. Accordingly, ringing that occurs upon rising of normal data NDT can be cancelled by electrically connecting dummy data transfer line 4 to normal data transfer line 3.

When normal data NDT falls from power supply voltage VCC level to ground voltage GND level, normal data transfer line 3 is electrically coupled to dummy data transfer line 5, and is electrically isolated from dummy data transfer line 4. In this case, since normal data NDT and dummy data DD2 have equal amplitudes, two kinds of ringing having the same amplitudes occur in the opposite phases and therefore cancel each other.

Complicated reflection may occur, e.g., in the case where a plurality of semiconductor devices are coupled in parallel to the same transfer line, or the transfer line is arranged over a plurality of layers via through-holes in a multi-layer board. Even in such a case, the ringing can be excluded by arranging the dummy data transfer lines, which have the same signal transmission characteristics as the normal data transfer line, in the same fashion as the normal data transfer line.

According to the above description, data is transmitted from sending device 1 to receiving device 2. However, transfer lines 3–5 can be bidirectional bus lines without any problem. The bidirectional data transmission can be achieved by arranging output level converters and dummy output drivers as well as switching circuits 2a in both the sending and receiving devices.

Sending device 1 and receiving device 2 may be memory devices or processors. They are merely required to be included in a system in which signal/data is transmitted.

As described above, according to the first embodiment, the dummy data transfer line pair having the same signal transmission characteristics as the normal data transfer line are additionally arranged, data/signal complementary to the normal data/signal is transmitted through the dummy data transfer line pair, and the dummy data transfer lines are selectively and electrically connected, in the receiving side, to the normal data transfer line, whereby occurrence of ringing can be prevented. Accordingly, the current drive capability of the output drive transistor can be increased by increasing the size (a ratio of the channel width to the channel length) of the transistors included in the output driver of the sending device of the transfer line, and the level transition time of the output signal waveform can be reduced, and therefore fast transfer of data/signal can be performed. Thus, the system capable of fast operation can be achieved.

By applying the input/output interface to a clock signal defining an operation speed of a system, the fast clock signal can be transmitted, and the operation speed of the whole system can be improved.

Second Embodiment

FIG. 2A shows a structure of an input/output interface circuit according to a second embodiment of the invention. In the structure shown in FIG. 2A, dummy data DD1 transmitted via dummy data transfer line 4 changes between a high voltage VPP (VPP≠VCC) and power supply voltage VCC, and dummy data DD2 transmitted via dummy data transfer line 5 changes between ground voltage GND and a negative voltage VBB (VBB≠−VCC). Normal data NDT changes between power supply voltage VCC and ground voltage GND. Each of data transfer lines 3–5 has a characteristic impedance Z.

The signal having a level converted by output level converter 1d is applied to output drivers 1a–1c. Dummy output driver 1a operates using high voltage VPP and power supply voltage VCC as its operation power supply voltages. Normal output driver 1b operates using power supply voltage VCC and ground voltage GND as its operation power supply voltages. Output driver 1c operates using ground voltage GND and negative voltage VBB as its operation power supply voltages. In accordance with the operation power supply voltages of output drivers 1a–1c, output level converter 1d converts the voltage level of a received signal.

In dummy output driver 1a, a P-channel MOS transistor Qa for driving dummy data transfer line 4 to high voltage VPP level has an equivalent resistance (channel resistance in the on-state) Rpa, and an N-channel MOS transistor Qb for driving dummy data transfer line 4 to power supply voltage VCC level has an equivalent resistance Rna. In normal output driver 1b, a P-channel MOS transistor Qc for driving normal data transfer line 3 to power supply voltage VCC level has an equivalent resistance Rpb, and an N-channel MOS transistor Qd for driving normal data transfer line 3 to ground voltage GND level has an equivalent resistance Rnb.

In dummy output driver 1c, a P-channel MOS transistor Qe for driving dummy data transfer line 5 to the ground voltage level has an equivalent resistance Rpc, and an N-channel MOS transistor Qf for driving dummy data transfer line 5 to negative voltage VBB level has an equivalent resistance Rnc.

Figure 2B:
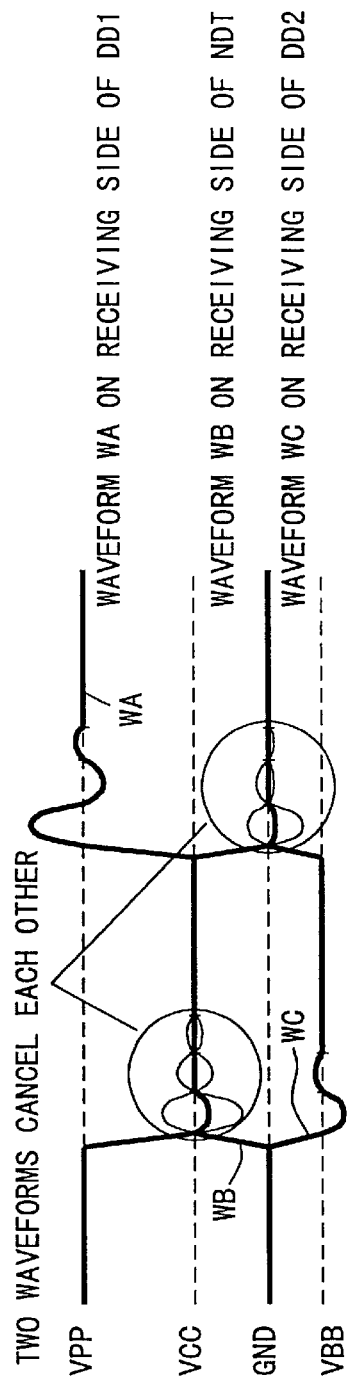
FIG. 2B is a signal waveform diagram representing an operation of the input/output interface shown in FIG. 2A.

By adjusting the equivalent resistances of the MOS transistors in the output drivers of sending device 1, ringing can be accurately cancelled as shown in FIG. 2B even if dummy data DD1 and DD2 transmitted through dummy data transfer lines 4 and 5 differ in amplitude from normal data NDT transmitted via normal data transfer line 3. More specifically, as shown in FIG. 2B, if ringings on the receiving side of waveforms WA and WC of dummy data DD1 and DD2 may occur in the phase opposite to that of ringing caused by waveform WB on the receiving side of normal data NDT and these ringings may have amplitudes equal to each other or satisfying a predetermined relationship, the ringing can be accurately eliminated.

In the case where sending device 1 and receiving device 2 are dynamic semiconductor memory devices, high voltage VPP for selecting a word line and a negative voltage VBB for biasing a substrate are internally generated. Accordingly, input and output (sending and receiving) of data/signal can be performed by utilizing internally generated high voltage VPP and negative voltage VBB without utilizing voltages such as 2·VCC and -VCC which are dedicated to the interface. Description will now be given on conditions for reliably canceling the ringing.

In the case where an output drive transistor having equivalent resistance R generates a signal rising from ground voltage GND to power supply voltage VCC onto a transfer line having characteristic impedance Z, overshoot of a magnitude, expressed by the following representation, occurs in the data receiving device after propagation time tpd of the transfer line:

$$VCC \cdot (Z-R)/(Z+R) = VCC \cdot \Gamma$$

This overshoot is reflected at the receiving side to the sending end, and then is reflected at the sending end so that the undershoot of a magnitude, expressed by the following representation, occurs after propagation time tpd:

$$VCC \cdot (Z-R)^2/(Z+R)^2 = VCC \cdot \Gamma^2$$

The first overshoot comes from that impedance mismatching between equivalent resistance R on the sending end and the characteristic impedance of the transfer line causes reflection to superimpose the signal of the same phase on the data transfer line. The undershoot is caused by the operation that the overshoot is reflected at the receiving end, and is reflected again at the sending end so that the waveform having the opposite phase is returned via the transfer line.

Accordingly, under the conditions that dummy data DD1 and DD2 differ in amplitude from normal data NDT, it is merely required to determine the equivalent resistances of MOS transistors Qa–Qf included in output drivers 1a–1c such that the first overshoot and undershoot forming a main factor in malfunction may be suppressed to a maximum extent.

Figure 3:
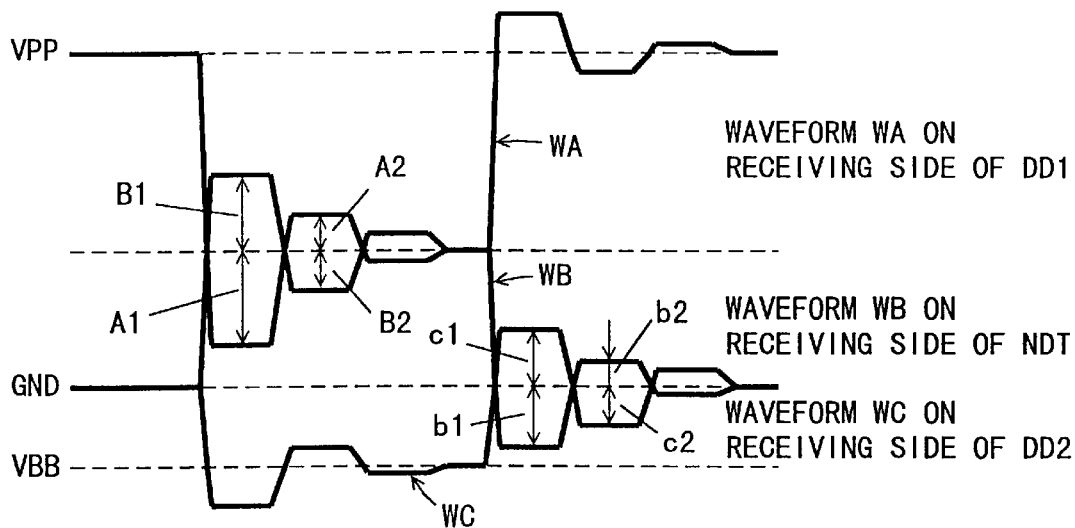
FIG. 3 shows a reception signal waveform of a receiving device.

FIG. 3 shows input waveforms on the receiving side in greater detail. In normal data NDT shown in FIG. 3, an amount of the first overshoot is equal to B1. Overshoot of B1 is reflected, and undershoot of B2 in amount occurs after elapsing of time 2·tpd. Dummy data DD1 lowers from high voltage VPP level to power supply voltage VCC level, and therefore undershoot of A1 in amount occurs. Then, this undershoot is reflected to form overshoot upon elapsing of time 2·tpd. This overshoot is equal to A2 in amount. For suppressing ringing upon rising of normal data NDT, the magnitudes of overshoot amounts B1 and A2 and undershoot amounts A1 and B2 are adjusted such that neither overshoot nor undershoot occur in normal data NDT.

Likewise, upon falling of normal data NDT, undershoot of a magnitude of b1 occurs in normal data NDT, and subsequently overshoot of a magnitude of b2 occurs. During this period, overshoot of a magnitude of c1 occurs in dummy data DD2, and subsequently undershoot of a magnitude of c2 occurs. Accordingly, by canceling them to a maximum extent, it is possible to suppress the ringing of normal data NDT on the receiving side.

Figure 4A:
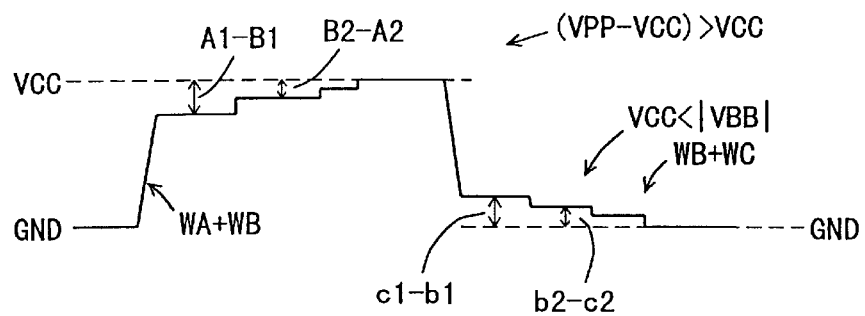
FIGS. 4A and 4B schematically show waveforms of a combined signal on the receiving side.

As shown in FIG. 4A, if dummy data DD1 has an amplitude (VPP−VCC) larger than amplitude VCC of normal data NDT, the amount of undershoot of dummy data DD1 exceeds the amount of overshoot of normal data NDT. In this case, therefore, the equivalent resistances of transistors in the output drivers are determined such that normal data NDT may gradually approach power supply voltage VCC, or the conditions of A1>B1 and B2>A2 may be satisfied.

In the case where the amplitude of |VBB| of dummy data DD2 is larger than amplitude of VCC of normal data NDT, the amount of first overshoot of dummy data DD2 is larger than the amount of first undershoot of normal data NDT. In this case, therefore, the equivalent resistances of transistors of the output drivers are determined to satisfy the conditions of c1>b1 and b2>c2. Under these conditions, as shown in FIG. 4A, a combined waveform on the normal data receiving side gradually approaches ground voltage GND, and ringing does not occur.

If dummy data DD1 has the amplitude smaller than that of normal data NDT, the amount of the first overshoot of normal data NDT is larger than the amount of the first undershoot of dummy data DD1. In this case, equivalent resistances of MOS transistors of the output drivers are so set as to satisfy the conditions of B1>A1 and A2>B2. In this case, as shown in FIG. 4B, the combined waveform of normal data NDT reaches power supply voltage VCC after it exceeds power supply voltage VCC, and the ringing does not occur.

Likewise, when normal data NDT has the amplitude of VCC larger than the amplitude of |VBB| of dummy data DD2, the amount of first undershoot of normal data NDT exceeds the amount of first overshoot of dummy data DD2. In this case, therefore, the equivalent resistances of MOS transistors of the output drivers are so determined as to satisfy the conditions of b1>c1 and c2>b2. Under these conditions, the normal data gradually reaches ground voltage GND after it exceeds ground voltage GND, and the ringing does not occur.

Figure 4B:
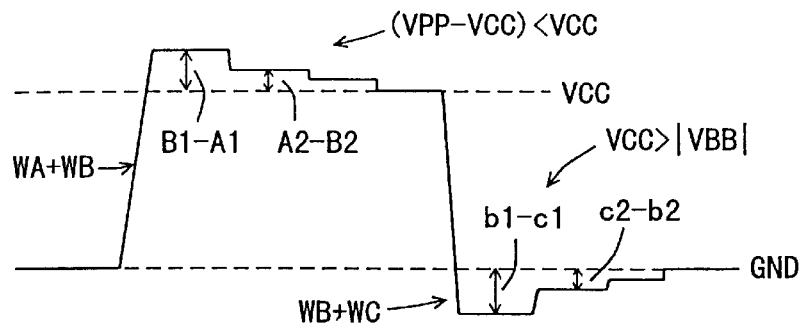

For achieving the waveforms shown in FIGS. 4A and 4B, the equivalent resistance values of the output drivers are set in accordance with the relationship in magnitude between amplitude VCC of normal data NDT and amplitudes (VPP−VCC) and |VBB| of dummy data DD1 and DD2. If dummy data DD1 and DD2 are equal in amplitude to normal data NDT, all output drivers 1a−1c are determined to have the transistors of equal equivalent resistance values. Thereby, the amounts of overshoot and undershoot become equal to each other, and occurrence of ringing is accurately suppressed. From the above description, the following relations can be derived:

(i) If (VPP−VCC)>VCC:
B1=VCC·(Z−Rpb)/(Z+Rpb)
<(VPP−VCC)·(Z−Rna)/(Z+Rna)=A1, and
B2=VCC·(Z−Rpb)$^2$/(Z+Rpb)$^2$
>(VPP−VCC)·(Z−Rna)$^2$/(Z+Rna)$^2$=A2

(ii) If (VPP−VCC)<VCC:
B1=VCC·(Z−Rpb)/(Z+Rpb)
>(VPP−VCC)·(Z−Rna)/(Z+Rna)=A1, and
B2=VCC·(Z−Rpb)$^2$/(Z+Rpb)$^2$
<(VPP−VCC)·(Z−Rna)$^2$/(Z+Rna)$^2$A2

(iii) If VCC>|VBB|:
c1=|VBB|·(Z−Rpc)/(Z+Rpc)
<VCC·(Z−Rnb)/(Z+Rnb)=b1, and
c2=|VBB|·(Z−Rpc)$^2$/(Z+Rpc)$^2$
>VCC·(Z−Rnb)$^2$/(Z+Rnb)$^2$=b2

(iv) If VCC<|VBB|:
c1=|VBB|·(Z−Rpc)/(Z+Rpc)
>VCC·(Z−Rnb)/(Z+Rnb)=b1, and
c2=|VBB|·(Z−Rpc)$^2$/(Z+Rpc)$^2$
<VCC·(Z−Rnb)$^2$/(Z+Rnb)$^2$=b2

According to the second embodiment of the invention, as described above, if dummy data DD1 and DD2 differ in amplitude from normal data NDT, the amounts of undershoot and overshoot of the dummy data and normal data are adjusted so that the signal on the receiving input node may change on only one of the power supply voltage side and the ground voltage side, and the dummy data can be produced by utilizing the voltage produced from internal voltage generating circuitry in the semiconductor device. Therefore, the power supply structure can be simplified.

Third embodiment

Figure 5A:
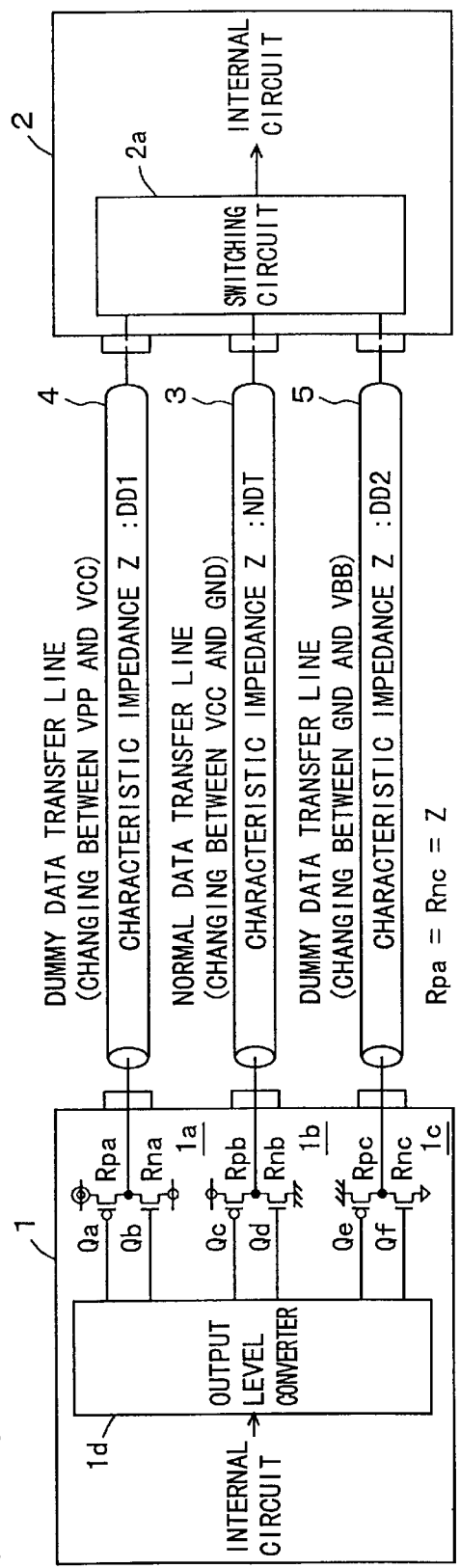
FIG. 5A schematically shows a structure of an input/outpt interface according to a third embodiment of the invention.

FIG. 5A schematically shows a structure of an I/O interface circuit according to a third embodiment of the invention. In the structure of the I/O interface circuit shown in FIG. 5A, output drive transistors Qb, Qc, Qd and Qe of sending device 1 have equivalent resistances determined in the same manner as in the second embodiment. MOS transistor Qa included in dummy output driver 1a has equivalent resistance Rpa determined to be equal to characteristic impedance Z of dummy data transfer line 4. In dummy output driver 1c, N-channel MOS transistor Qf has equivalent resistance Rnc set to be equal to characteristic impedance Z of dummy data transfer line 5. Normal data transfer line 3 has characteristic impedance Z.

Accordingly, when P-channel MOS transistor Qa is turned on to drive dummy data transfer line 4 from power supply voltage VCC level to high voltage VPP level, reflection does not occur, and ringing does not occur. Likewise, when N-channel MOS transistor Qf in output driver 1c is turned on, and dummy data transfer line 5 is driven from ground voltage GND level to negative voltage VBB level, ringing does not occur on dummy data transfer line 5. Dummy data DD1 and DD2 are complementary to normal data NDT. When the voltage level on dummy data transfer line 4 rises, dummy data transfer line 4 is isolated from normal data transfer line 3. If ringing occurs on dummy data transfer line 4, the ringing may adversely affect the operation in the next cycle, and therefore may impede fast operation. Likewise, dummy data transfer line 5 is isolated from normal data transfer line 3 when normal data NDT on dummy data transfer line 5 rises. If ringing occurs in this case, the ringing is not cancelled, and therefore may adversely affect the operation in the next cycle.

Figure 5B:
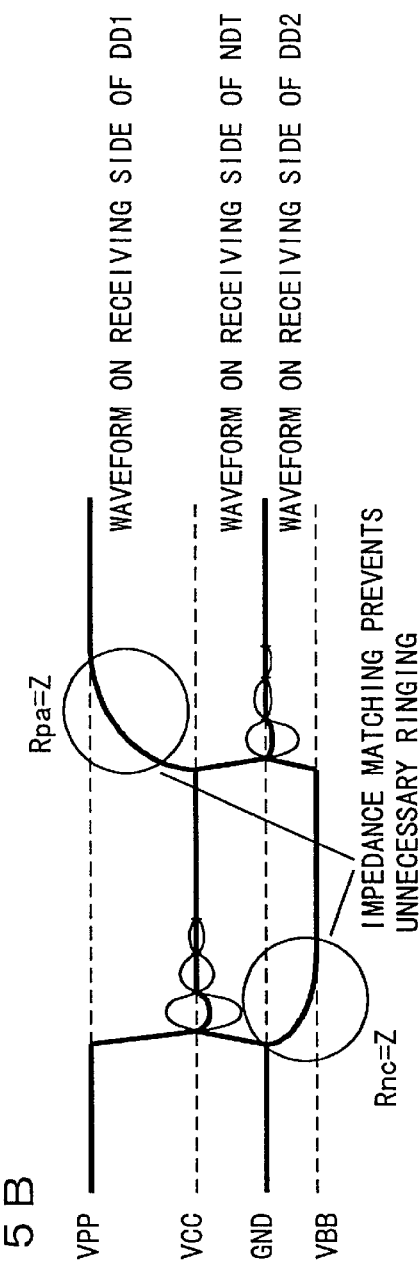
FIG. 5B is a signal waveform diagram representing an operation of the structure shown in FIG. 5A.

Accordingly, the equivalent resistance of MOS transistor Qa for rising the voltage level on dummy data transfer line 4 as well as equivalent resistance Rnc of MOS transistor Qf for lowering the voltage level on dummy data transfer line 5 are both set to be equal to characteristic impedance Z of data transfer lines. In this case, as shown in FIG. 5B, the reflection coefficient is equal to 0, and without a reflection wave the voltage level of dummy data DD1 slowly rises and the voltage level of dummy data DD2 slowly lowers. The rising waveform of dummy data DD1 and the falling waveform of dummy data DD2 are neither utilized for preventing ringing of normal data NDT, nor utilized in internal circuitry of receiving device 2. Accordingly, increase in equivalent resistances Rpa and Rnc of MOS transistors Qa and Qf does not exert any adverse influence on the fast operationability, and the occurrence of ringing is prevented while increasing the signal transition time. Unnecessary ringing adversely affecting the operation in the next cycle is suppressed, and fast transfer of the signal/data can be achieved without causing ringing.

Fourth Embodiment

A fourth embodiment will be described particularly giving a weight on a specific structure of the output circuit of sending device 1.

(First Structure of Output Circuit)

Figure 6:
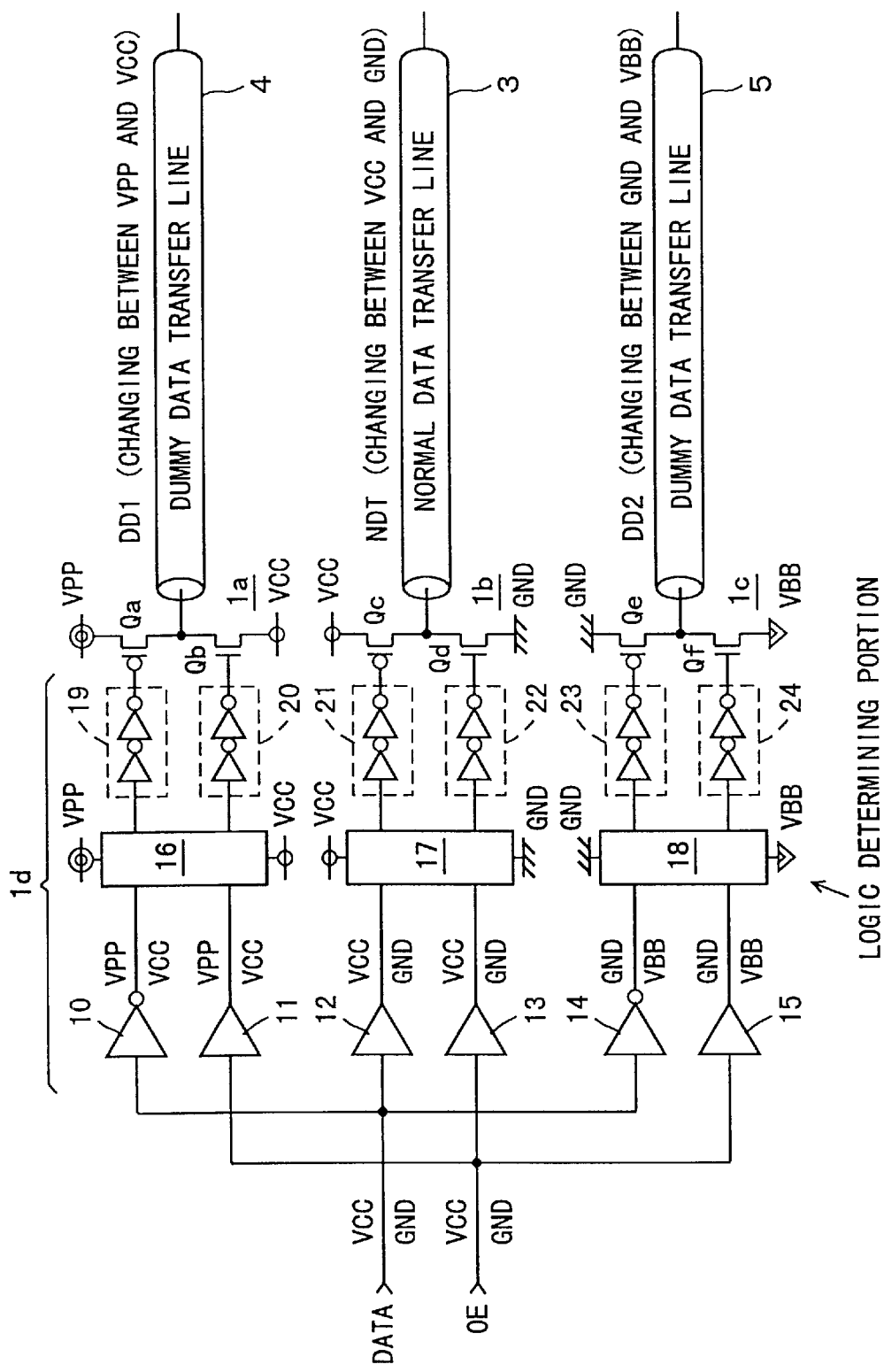
FIG. 6 schematically shows a structure of a data output circuit according to a fourth embodiment of the invention.

FIG. 6 schematically shows a first structure of the output circuit of the sending device. In FIG. 6, the normal data is produced and sent in accordance with internal data DATA.

In FIG. 6, internal data DATA and output enable signal OE are digital signals changing between power supply voltage VCC and ground voltage GND.

The output portion provided for dummy output driver 1a includes a level converter 10 for converting internal data DATA to a signal changing between high voltage VPP and power supply voltage VCC to produce an inverted signal in logic level of internal data DATA, a level converter 11 for converting output enable signal OE to a signal changing between high voltage VPP and power supply voltage VCC, a dummy logic determining portion 16 for producing an internal dummy data signal through determination of the logic level of the internal data in accordance with the output signals of level converters 10 and 11, and dummy timing adjusting circuits 19 and 20 for adjusting timing (rising/falling times) of the internal dummy data signals received from dummy logic determining portion 16, respectively.

Dummy timing adjusting circuit 19 applies its output signal to a gate of P-channel MOS transistor Qa of dummy output driver 1a. Dummy timing adjusting circuit 20 applies its output signal to a gate of N-channel MOS transistor Qb of dummy output driver 1a. Timing adjusting circuits 19 and 20 advance the timing of turn-off of output MOS transistors Qa and Qb, and delay the timing of turn-on of them so that occurrence of a through-current in dummy output driver 1a may be prevented.

The output portion for normal output driver 1b includes a buffer circuit 12 receiving internal data DATA, an output buffer circuit 13 receiving output enable signal OE, a logic determining circuit 17 for producing an internal data signal through determination of the logic level of internal data DATA in accordance with the output signals of buffer circuits 12 and 13, and timing adjusting circuits 21 and 22 receiving the internal data signal from logic determining circuit 17, to perform timing adjustment for driving MOS transistors Qc and Qd of normal output driver 1b.

Buffer circuits 12 and 13 receive power supply voltage VCC and ground voltage GND as their operation power supply voltages. Buffer circuits 12 and 13 are provided for adjusting the timing to compensate for the operation that the level conversion is performed for producing the dummy data. Timing adjusting circuits 21 and 22 adjust on/off timing of output MOS transistors Qc and Qd so as to prevent occurrence of a through-current in output driver 1b.

For dummy output driver 1c, there are arranged a level converter 14 receiving internal data DATA for conversion to a signal changing between ground voltage GND and negative voltage VBB to produce a signal at the logic level opposite to that of internal data DATA, a level converter 15 for converting output enable signal OE to a signal changing between ground voltage GND and negative voltage VBB, a logic determining circuit 18 for determining the logic level of the internal dummy data signal in accordance with the output signals of level converters 14 and 15 to produce an internal dummy data signal, and timing adjusting circuits 23 and 24 for performing timing adjustment on the respective internal dummy data signals received from logic determination circuit 18, to drive P-channel MOS transistor Qf of dummy output driver 1c.

Timing adjusting circuits 23 and 24 adjust the timing of signals applied to the gates of MOS transistors Qe and Qf for preventing occurrence of a through-current in dummy output driver 1c.

Figure 22:
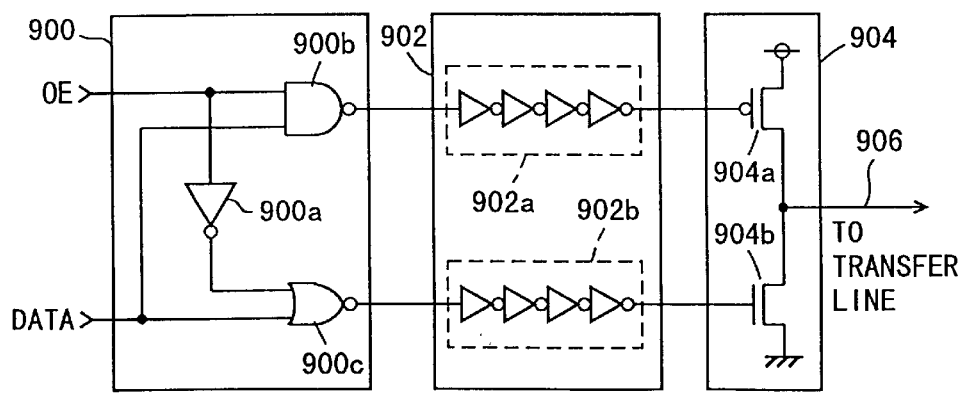
FIG. 22 schematically shows a structure of a data output portion of a memory device shown in FIG. 21;.
Figure 27:
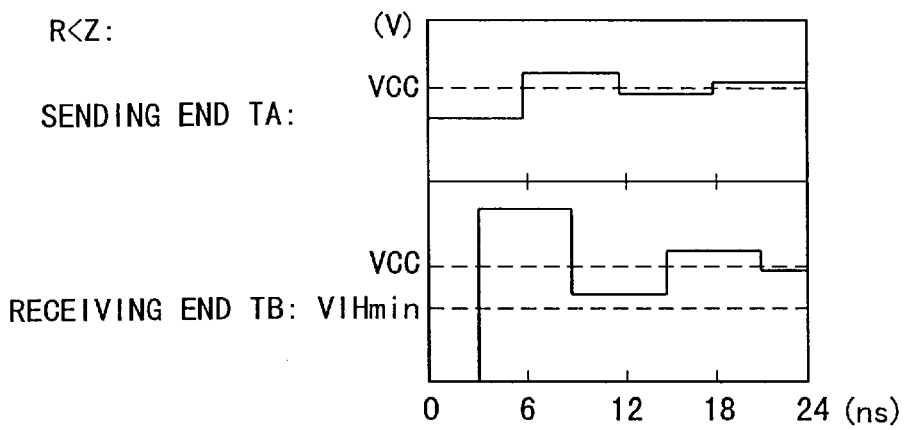
FIG. 27 shows reflected waves on the transfer line in FIG. 26.
Figure 28:
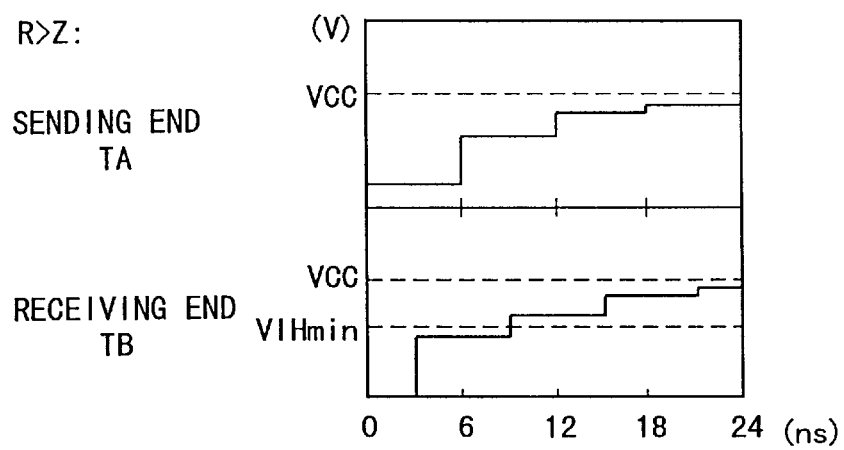
FIG. 28 shows reflected waves on the transfer line in FIG. 26.
Figure 29:
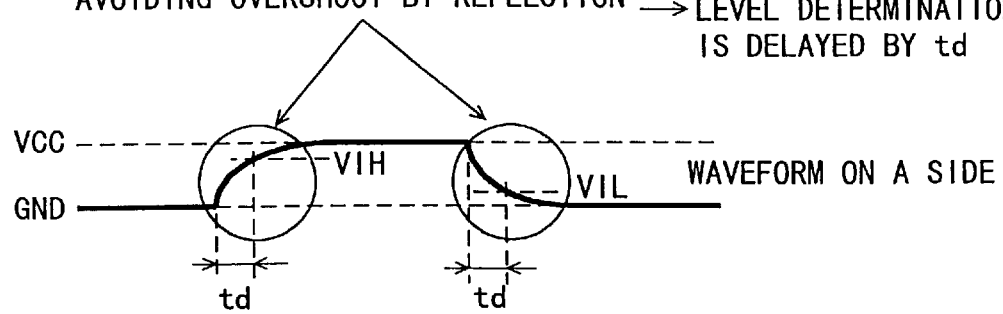
FIG. 29 shows a sent waveform of a system.
Figure 30A:
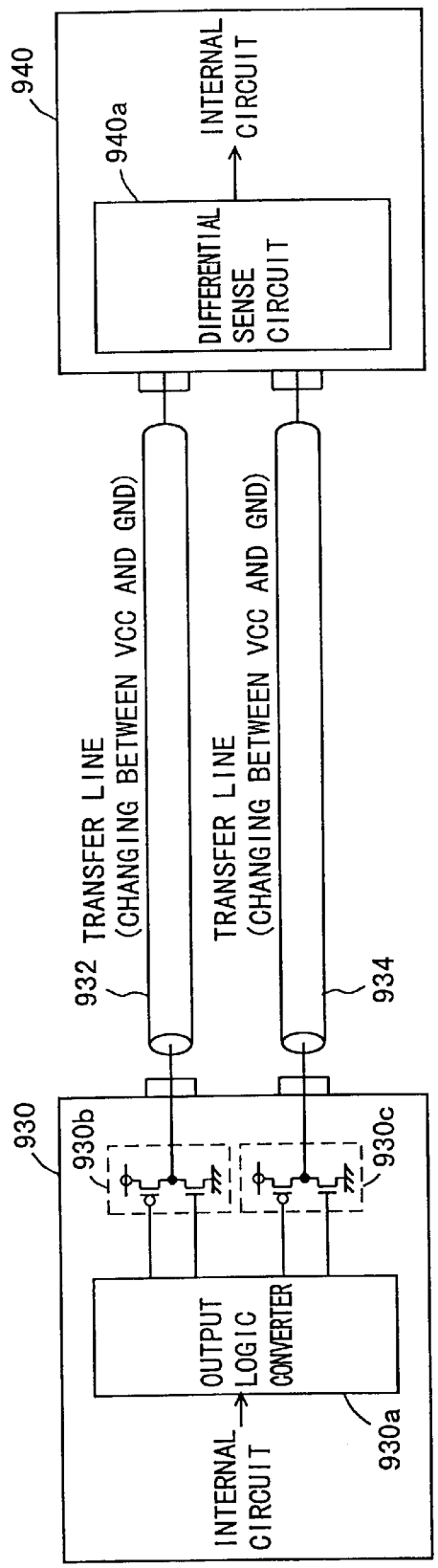
FIG. 30A shows by way of example of a conventional fast communication interface system.
Figure 30B:
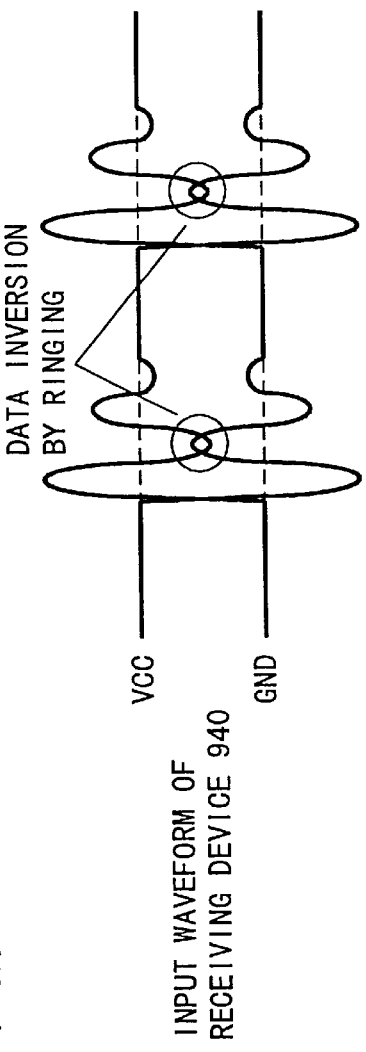
FIG. 30B is a signal waveform diagram illustrating a problem of the input/output interface shown in FIG. 30A.

Logic determining circuits 16–18 each have a structure similar to that of the logic determining circuit shown in FIG. 22. Logic determining circuit 16 operates using high voltage VPP and power supply voltage VCC as its operation power supply voltages. Likewise, timing adjusting circuits 19 and 20 receive high voltage VPP and power supply voltage VCC as their operation power supply voltages. Logic determining circuit 18, and timing adjusting circuits 23 and 24 receive ground voltage GND and negative voltage VBB as their operation power supply voltages.

Level converters 10 and 14 invert the logic level of internal data DATA, and the logic level of their output signals is different from the internal data signal generated from buffer circuit 12. Thus, it is easy to provide data signals, which are complementary to the data signal of normal data transmitted onto normal data transfer line 3, as the dummy data transmitted on dummy data transfer lines 4 and 5. Further, buffer circuits 12 and 13 are employed for compensating for times required for level conversion of level converters 10, 11, 14 and 15, and the dummy data transferred onto dummy data transfer lines 4 and 5 can be synchronized with the normal data transferred onto normal data transfer line 3.

Figure 7:
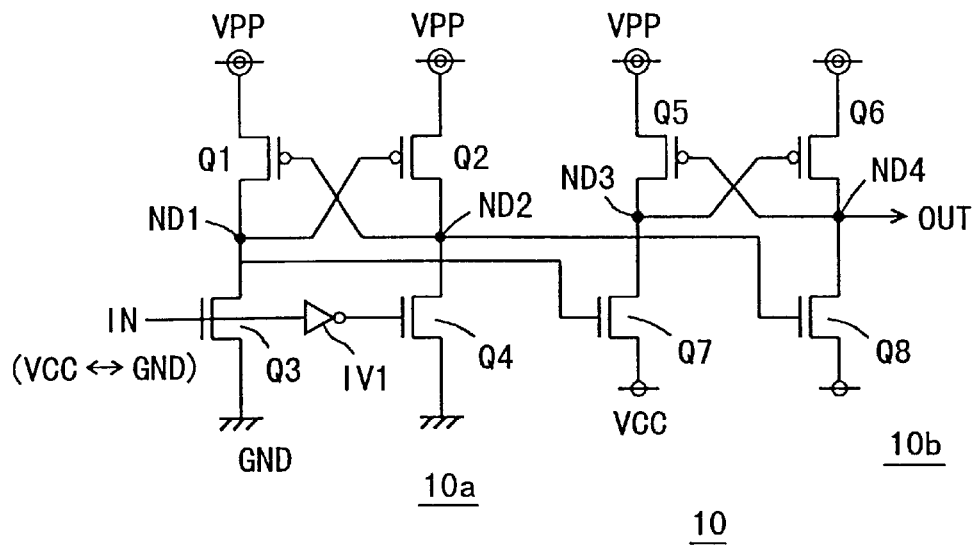
FIG. 7 shows by way of example a structure of a level converter shown in FIG. 6.

FIG. 7 shows an example of a structure of level converter 10 shown in FIG. 6. In FIG. 7, level converter 10 includes an initial level converter 10a that converts an input signal IN (internal data DATA) to a signal changing between high voltage VPP and ground voltage GND, and a final level converter 10b that receives the output signal of initial level converter 10a for conversion to a signal changing between high voltage VPP and power supply voltage VCC.

Initial level converter 10a includes: a P-channel MOS transistor Q1 which is connected between a high voltage node receiving high voltage VPP and a node ND1, and has a gate connected to a node ND2; a P-channel MOS transistor Q2 which is connected between the high voltage node and node ND2, and has a gate connected to node ND1; an N-channel MOS transistor Q3 which is connected between node ND1 and the ground node receiving ground voltage GND, and has a gate receiving input signal IN (internal data DATA); an inverter IV1 which receives power supply voltage VCC and ground voltage GND as its operation power supply voltages, and inverts input signal IN; and an N-channel MOS transistor Q4 which is connected between node ND2 and the ground node, and has a gate receiving the output signal of inverter IV1.

Final level converter 10b includes: a P-channel MOS transistor Q5 which is connected between the high voltage node and a node ND3, and has a gate connected to an output node ND4; a P-channel MOS transistor Q6 which is connected between the high voltage node and output node ND4, and has a gate connected to node ND3; an N-channel MOS transistor Q7 which is connected between node ND3 and the power supply node receiving power supply voltage VCC, and has a gate connected to node ND1; and an N-channel MOS transistor Q8 which is connected between output node ND4 and the power supply node, and has a gate connected to node ND2.

When input signal IN is at ground voltage GND level, MOS transistor Q3 in initial level converter 10a is off, and MOS transistor Q4 is on. Node ND2 is driven to ground voltage GND level, and MOS transistor Q1 is turned on to drive node ND1 to high voltage VPP level for turning off MOS transistor Q2. Therefore, node ND1 in initial level converter 10a attains high voltage VPP level, and node ND2 attains ground voltage GND level.

In this state, MOS transistor Q7 in final level converter 10b is turned on by high voltage VPP on node ND1 applied to its gate, and MOS transistor Q8 is turned off by the ground voltage on node ND2 applied to its gate. Node ND3 is driven to power supply voltage VCC level by MOS transistor Q7 so that MOS transistor Q6 is turned on to drive output node ND4 to high voltage VPP level. When output node ND4 is driven to high voltage VPP level, MOS transistor Q5 is turned off. Therefore, input signal IN at the ground voltage level (L-level) is converted to output signal OUT at high voltage VPP level (H-level).

When input signal IN is at power supply voltage VCC level, node ND1 is driven to the ground voltage level by MOS transistor Q3 so that MOS transistor Q2 is turned on to drive node ND2 to high voltage VPP level. Transistors Q1 and Q4 are off.

In final level converter 10b, MOS transistor Q7 is turned off by the ground voltage on node ND1 applied to its gate, and MOS transistor Q8 is tuned on by high voltage VPP on node ND2 applied to its gate so that output node ND4 is driven to power supply voltage VCC level. When output node ND4 is driven to power supply voltage VCC level, MOS transistor Q5 is turned on, and node ND3 is driven to high voltage VPP level to turn off MOS transistor Q6. Therefore, signal OUT at power supply voltage VCC level (L-level) is produced from input signal IN at power supply voltage VCC level (H-level). Accordingly, input signal IN (internal data DATA) changing between power supply voltage VCC and ground voltage GND is converted to output signal OUT changing between high voltage VPP and power supply voltage VCC. During the above operation, the logic level of input signal IN and the logic level of output signal OUT are inverted with each other.

When node ND1 is connected to a gate of MOS transistor Q8, and node ND2 is connected to a gate of MOS transistor Q7, level converter 11 shown in FIG. 6 is implemented Oogic level conversion is not performed).

Figure 8:
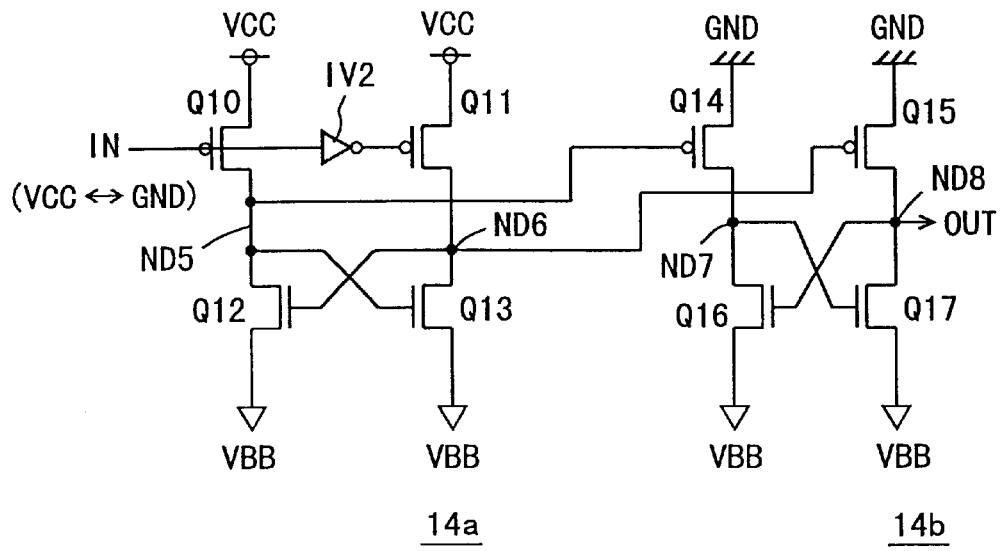
FIG. 8 schematically shows a structure of another level converter shown in FIG. 6.

FIG. 8 shows by way of example of a structure of level converter 14 shown in FIG. 6. In FIG. 8, level converter 14 includes: an initial level converter 14a which converts input signal IN (internal data DATA) changing between power supply voltage VCC and ground voltage GND to a signal changing between power supply voltage VCC and negative voltage VBB; and a final level converter 14b which converts the output signal of initial level converter 14a to a signal changing between ground voltage GND and negative voltage VBB.

Initial level converter 14a includes: a P-channel MOS transistor Q10 which is connected between the power supply node supplying power supply voltage VCC and a node ND5, and has a gate receiving input signal IN; a P-channel MOS transistor Q11 which is connected between the power supply node and a node ND6, and has a gate receiving input signal IN via inverter IV2; an N-channel MOS transistor Q12 which is connected between node ND5 and a negative voltage node receiving negative voltage VBB, and has a gate connected to node ND6; and an N-channel MOS transistor Q13 which is connected between node ND6 and the negative voltage node, and has a gate connected to node ND5.

Final level converter 14b includes: a P-channel MOS transistor Q14 which is connected between the ground node and a node ND7, and has a gate connected to node ND5; a P-channel MOS transistor Q15 which is connected between the ground node and a node ND8, and has a gate connected to node ND6; an N-channel MOS transistor Q16 which is connected between node ND7 and the negative voltage node, and has a gate connected to node ND8; and an N-channel MOS transistor Q17 which is connected between node ND8 and the negative voltage node, and has a gate connected to node ND7.

Inverter IV2 receives power supply voltage VCC and the ground voltage as its operation power supply voltages.

When input signal IN is at ground voltage GND level, P-channel MOS transistor Q10 is on, and P-channel MOS transistor Q11 is off. Accordingly, node ND5 is driven to power supply voltage VCC level, and MOS transistor Q13 is turned on to drive node ND6 to negative voltage VBB level. When node ND6 is driven to negative voltage VBB level, N-channel MOS transistor Q12 is turned off.

In final level converter 14b, node ND5 is at power supply voltage VCC level, and node ND6 is at negative voltage VBB level. Accordingly, P-channel MOS transistor Q14 is off, and P-channel MOS transistor Q15 is on so that node ND8 is at ground voltage GND level. When node ND8 attains ground voltage GND level, MOS transistor Q16 is turned on to drive node ND7 to negative voltage VBB level so that MOS transistor Q17 is turned off. Accordingly, output signal OUT at ground voltage GND level (H-level) is produced from input signal IN at ground voltage GND level (L-level). The H-level of this output signal OUT is equal to ground voltage GND level, and thus the logic level of input signal IN is inverted.

When input signal IN is at power supply voltage VCC level, MOS transistor Q11 is on, and MOS transistor Q10 is off so that node ND6 is driven to power supply voltage VCC level. Also, node ND5 is driven to negative voltage VBB level, and has the voltage level thereof latched. In this state, MOS transistor Q15 is off, and MOS transistor Q14 is on so that node ND7 is at ground voltage GND level, and MOS transistor Q17 is on. Therefore, output signal OUT sent from node ND8 is at negative voltage VBB level. MOS transistor Q16 is off, and nodes ND7 and ND8 are held at ground voltage GND level and negative voltage VBB level, respectively. Accordingly, input signal IN (H-level) at power supply voltage VCC level is converted to output signal OUT at negative voltage VBB level (L-level).

Nodes ND5 and ND6 may be connected to the gates of P-channel MOS transistors Q15 and Q14, respectively. This connection provides level converter 15 which produces output signals OUT at ground voltage GND level and negative voltage VBB level in response to power supply voltage VCC level and ground voltage GND level of input signal IN, respectively.

The level converters shown in FIGS. 7 and 8 have been described only by way of example, and may have structures of level converters of the inverter type and sense amplifier type level converter other than the above described arrangements. For example, such a structure may be utilized that input signal IN and an intermediate voltage (=VCC/2) are compared in a differential stage, and the output signal of this differential stage is latched by cross-coupled MOS transistors (e.g., a differential amplifier circuit of the latch type can be utilized).

According to the first structure of the output circuit, as described above, level conversion of the internal data is performed in parallel with that of the timing signal, and the logic inversion is effected on the dummy data signals. Therefore, complementary dummy data synchronized with the normal data can be easily produced.

[Second Structure of Output Circuit]

Figure 9:
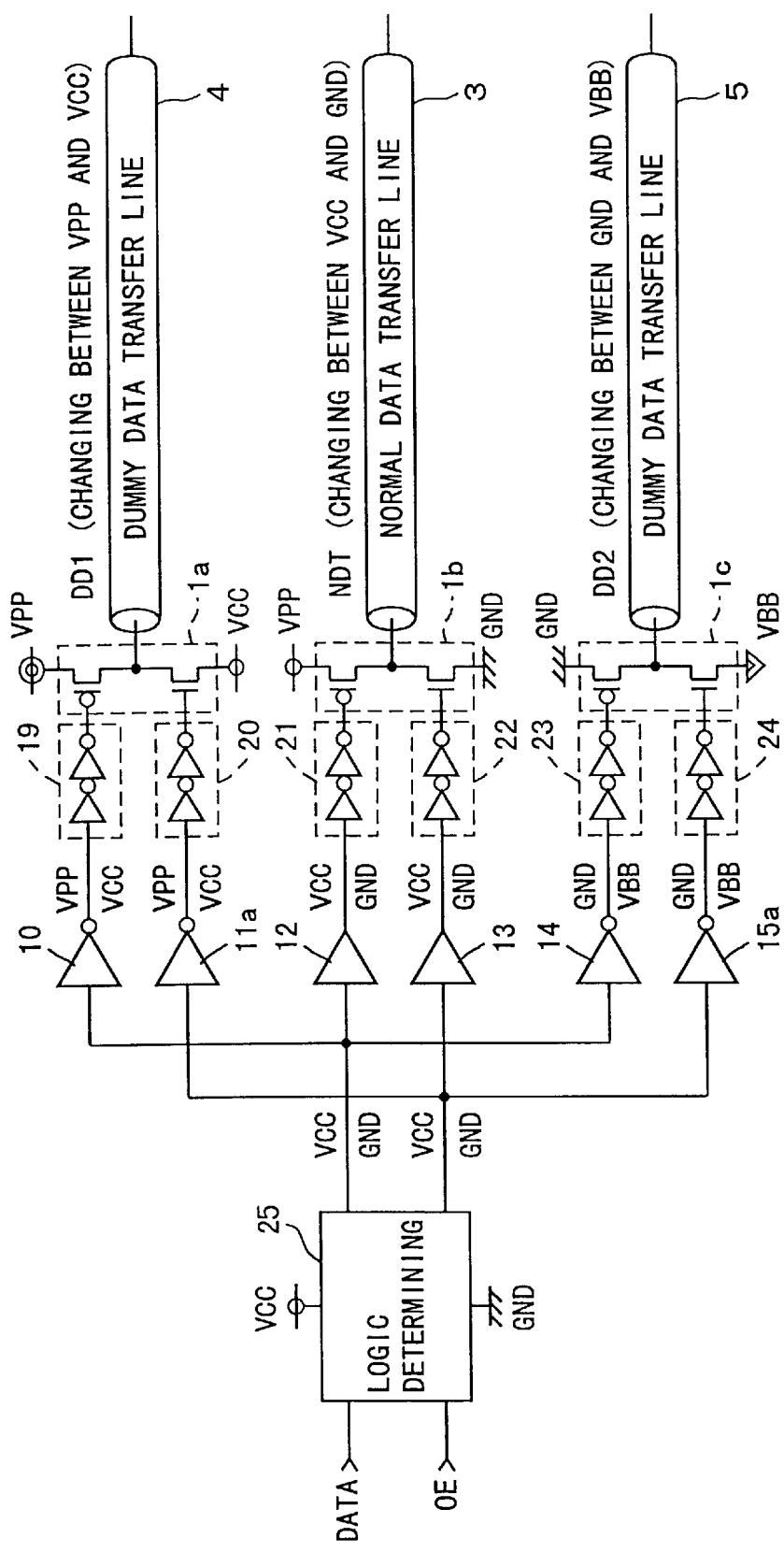
FIG. 9 shows another structure of a data output circuit of the fourth embodiment of the invention.

FIG. 9 shows a second structure of the output circuit. In the structure of the output circuit shown in FIG. 9, a logic determining circuit 25 for determining the logic of data sent from the output circuit in accordance with internal data DATA and output enable signal OE is provided commonly to the dummy data and the normal data. Since logic determining portion 25 is common to the dummy and normal data, inverter buffer circuits 11a and 15a each having a level converting function are provided for drivers 20 and 24 provided for dummy data transfer lines 4 and 5, respectively. Inverter buffer circuit 11a receives high voltage VPP and power supply voltage VCC as its operation power supply voltages. Inverter buffer circuit 15a receives ground voltage GND and negative voltage VBB as its operation power supply voltages. Structures other than the above are the same as those shown in FIG. 6. Corresponding parts and portions bear the same reference numerals, and description thereof is not repeated.

The logic determining circuit 25 receives power supply voltage VCC and ground voltage GND as its operation power supply voltages. For producing dummy data, level conversion and inversion of the logic level are effected on the signal at the logic level determined by logic determining circuit 25, and then the timing adjustment is performed so that dummy data is produced. In contrast to the structure shown in FIG. 6, therefore, it is not necessary to provide individual logic determining circuits for dummy data DD1 and DD2 and normal data NDT, respectively, so that the circuits components can be reduced in number, and therefore, the layout area can be reduced. As for the operation of the output circuit, the signal (having an amplitude of power supply voltage VCC level) at the logic level determined by logic determining circuit 25 is merely applied to buffer circuits 10–15a, and the operation is similar to the operation of the output circuit shown in FIG. 6. Thus, the operation is performed to produce dummy data DD1 and DD2, which are synchronized with normal data NDT and have the inverted logic level. For example, when normal output driver 1b generates a signal at H-level, dummy output drivers 1a and 1c generate signals at L-level.

When normal output driver 1b is at the output high impedance, dummy output drivers 1a and 1c may likewise be at the output high impedance. This arrangement can be achieved by such a structure that inverter buffer circuits 10, 11a, 14 and 15a are formed of EXOR circuits each having a level converting function, and output enable signal OE is applied to the EXOR circuits.

According to the fourth embodiment of the invention, as described above, the dummy data subjected to level conversion and inversion of logic level is produced from internal data in the sending device. Therefore, dummy data DD1 and DD2 which are synchronized with normal data NDT and have inverted logic levels can be easily produced.

Fifth Embodiment

A fifth embodiment of the invention is related to a structure of a switching circuit in an input initial stage of the receiving device.

(First Structure of Switching Circuit)

Figure 10:
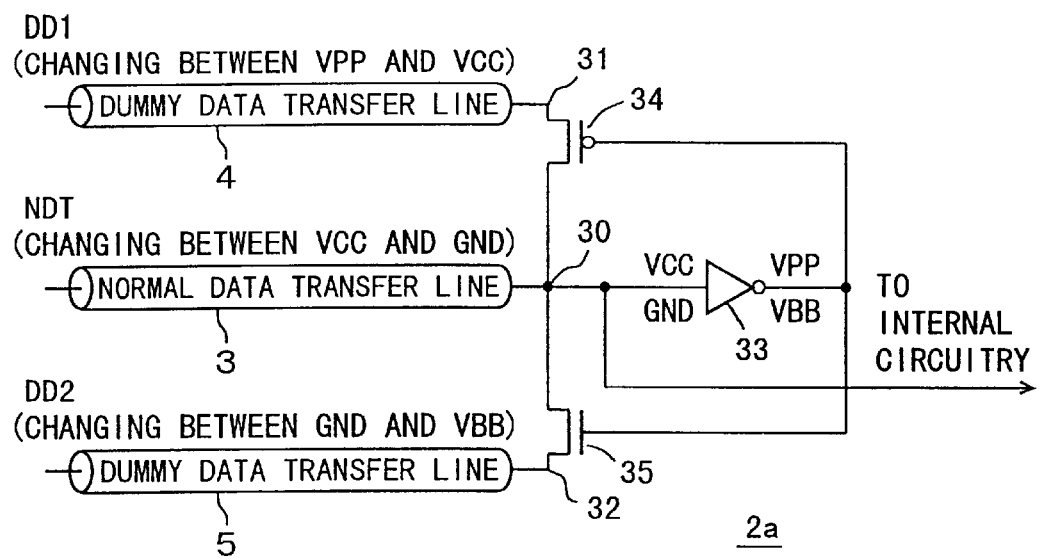
FIG. 10 shows a structure of a switching circuit according to a fifth embodiment of the invention.

FIG. 10 shows by way of example a structure of switching circuit 2a according to a fifth embodiment of the invention. Switching circuit 2a forms an input interface circuit arranged in the input portion of receiving device 2 as shown in FIG. 1.

In FIG. 10, switching circuit 2a includes: a level converter 33 which receives a digital signal applied to an input node 30 coupled to normal data transfer line 3, converts the digital signal changing between power supply voltage VCC and ground voltage GND to a signal changing between high voltage VPP and negative voltage VBB, and inverts the logic level thereof; a P-channel MOS transistor (switching transistor) 34 which is coupled between input node 30 and an input node 31 coupled to dummy data transfer line 4, and couples dummy data transfer line 4 and normal data transfer line 3 via internal nodes 31 and 30 in accordance with the output signal of level converter 33; and an N-channel MOS transistor (switching transistor) 35 which is selectively turned on in accordance with the output signal of level converter 33 for electrically coupling normal data transfer line 3 and dummy data transfer line 5 via input nodes 30 and 32. These switching transistors 34 and 35 are turned on complementarily to each other, and dummy data transfer lines 4 and 5 are complementarily and electrically coupled to normal data transfer line 3.

When normal data NDT applied to input node 30 rises from ground voltage GND to power supply voltage VCC, the output signal of level converter 33 lowers from high voltage VPP to negative voltage VBB so that dummy data transfer line 4 is electrically coupled to normal data transfer line 3, and dummy data transfer line 5 is isolated from normal data transfer line 3. Accordingly, ringing of normal data NDT can be cancelled by using ringing of dummy data DD1.

When normal data NDT lowers from power supply voltage VCC to ground voltage GND, the output signal of level converter 33 rises from negative voltage VBB to high voltage VPP. In this case, MOS transistor 34 is tuned off and MOS transistor 35 is turned on in accordance with the output signal of level converter 33 so that normal data transfer line 3 is electrically coupled to dummy data transfer line 5, and dummy data transfer line 4 is electrically isolated from normal data transfer line 3.

Upon falling of normal data NDT, therefore, ringing of normal data NDT can be cancelled by using ringing that occurs upon rising of dummy data DD2.

In the above operation, high voltage VPP may be at the voltage level equal to a doubled power supply voltage 2·VCC (VPP=2·VCC), or may be at another voltage level (VPP≠2·VCC). The voltage level of high voltage VPP is adjusted in accordance with the amplitudes of dummy data DD1 and DD2. The same is true also for negative voltage VBB. Accordingly, the structure of switching circuit 2a can be applied to the structure of any one of the input/output interface circuits of the first to third embodiments. The same is true also for the structures of switching circuits, which will be described later.

Level converter 33 which has a function of inverting the logic level of normal data NDT is utilized, and P- and N-channel MOS transistors 34 and 35 are also utilized. With the simple circuit structure, dummy data transfer lines 4 and 5 can be appropriately coupled to normal data transfer line 3 accurately in accordance with rising and falling of normal data NDT, and the ringing upon rising and falling of normal data NDT can be reliably cancelled.

Figure 11:
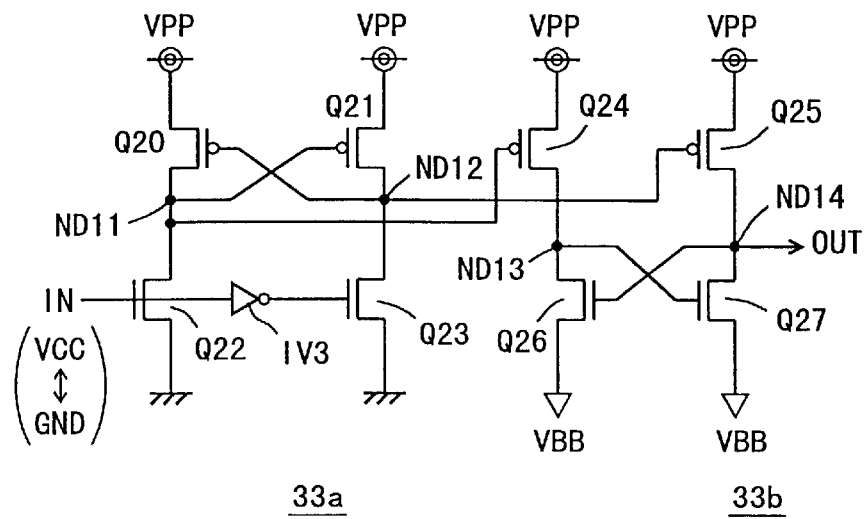
FIG. 11 shows by way of example a structure of a level converter shown in FIG. 10.

FIG. 11 shows by way of example the structure of level converter 33 shown in FIG. 10. Level converter 33 includes an initial level converter 33a for converting input signal IN changing between power supply voltage VCC and ground voltage GND to a signal changing between high voltage VPP and ground voltage GND, and a final level converter 33b for converting the output signal of initial level converter 33a to a signal changing between high voltage VPP and negative voltage VBB.

Initial level converter 33a includes; a P-channel MOS transistor Q20 which is connected between a high voltage node and a node ND11, and has a gate connected to a node ND12; a P-channel MOS transistor Q21 which is connected between the high voltage node and node ND12, and has a gate connected to node ND11; an N-channel MOS transistor Q22 which is connected between node ND11 and the ground node, and has a gate receiving input signal IN; and an N-channel MOS transistor Q23 which is connected between node ND12 and the ground node, and has a gate receiving input signal IN via an inverter IV3.

Final level converter 33b includes: a P-channel MOS transistor Q24 which is connected between the high voltage node and node ND13, and has a gate connected to node ND11; a P-channel MOS transistor Q25 which is connected between the high voltage node and a node ND14, and has a gate connected to node ND12; an N-channel MOS transistor Q26 which is connected between node ND13 and the negative voltage node, and has a gate connected to node ND14; and an N-channel MOS transistor Q27 which is connected between node ND14 and the negative voltage node, and has a gate connected to node ND13.

In level converter 33 shown in FIG. 11, when input signal IN is at ground voltage GND level, MOS transistor Q22 is off, and MOS transistor Q23 is on, so that node ND12 is at ground voltage GND level and node ND11 is at high voltage VPP level. In final level converter 33b, node ND12 is at ground voltage GND level, and node ND11 is at high voltage VPP level, so that MOS transistor Q25 is on and MOS transistor Q24 is off. Accordingly, node ND14 is driven to high voltage VPP level via MOS transistor Q25, and MOS transistor Q26 is turned on in accordance with rising of the voltage level on node ND14, to drive node ND13 to negative voltage VBB level. Responsively, MOS transistor Q27 is turned off. Thus, input signal IN at ground voltage GND level is converted to output signal OUT at high voltage VPP level.

When input signal IN is at power supply voltage VCC level, MOS transistor Q22 is on, and MOS transistor Q23 is off, so that node ND12 is at high voltage VPP level and node ND11 is at ground voltage GND level. Accordingly, MOS transistor Q24 is on and MOS transistor Q25 is off, so that node ND13 is driven to high voltage VPP level. Responsively, MOS transistor Q27 is turned on, and node ND14 is driven to negative voltage VBB level via MOS transistor Q27. When MOS transistor Q26 is turned off in accordance with the lowering of the voltage level on node ND14, and node ND14 reaches negative voltage VBB level, MOS transistor Q26 is completely turned off. Accordingly, input signal IN at power supply voltage VCC level is converted to output signal OUT at negative voltage VBB level, and both the conversion of voltage level and the inversion of logic level are performed.

According to the structure of the switching circuit shown in FIG. 10, the control signal is produced by converting the voltage level and logic level of the normal data signal on input node 30, and dummy data transfer lines 4 and 5 are electrically connected to normal data transfer line 3. With the simple circuit structure, dummy data transfer lines 4 and 5 can be connected to the normal data transfer line 3 in accordance with the changing direction of the logic level of the normal data so as to prevent ringing of the normal data.
(Second Structure of Switching Circuit)

Figure 12:
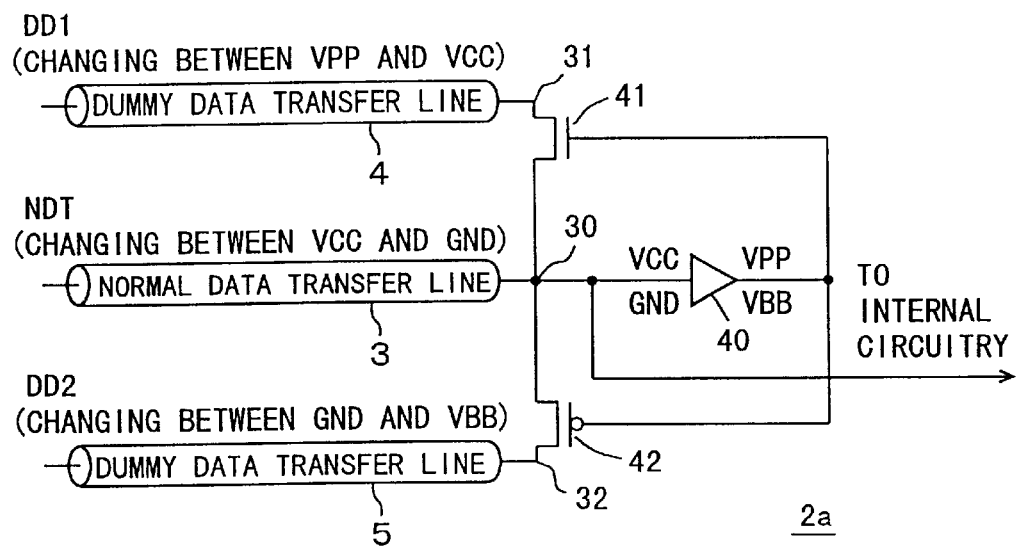
FIG. 12 shows a second structure of the switching circuit according to the fifth embodiment of the invention.

FIG. 12 shows a second structure of switching circuit 2a. Switching circuit 2a shown in FIG. 12, includes: a level converter 40 which converts the voltage level of normal data NDT applied thereto via input node 30 coupled to normal data transfer line 3; an N-channel MOS transistor 41 which is coupled between input node 30 and input node 31 coupled to dummy data transfer line 4, and electrically couples dummy data transfer line 4 to normal data transfer line 3 via input nodes 31 and 30 in response to the output signal of level converter 40; and a P-channel MOS transistor 42 which is coupled between input node 30 and input node 32 coupled to dummy data transfer line 5, and electrically couples dummy data transfer line 5 to normal data transfer line 3 via nodes 30 and 32 in response to the output signal of level converter 40.

Level converter 40 converts a signal changing between power supply voltage VCC and ground voltage GND to a signal changing between high voltage VPP and negative voltage VBB, and performs an amplitude expansion, but does not invert the logic level. Accordingly, when normal data NDT is H-level data rising from ground voltage GND level to power supply voltage VCC level, the output signal of level converter 40 is likewise at H-level, and N-channel MOS transistor 41 is turned on to couple dummy data transfer line 4 to normal data transfer line 3. When normal data NDT lowers from power supply voltage VCC to ground voltage GND level, the output signal of level converter 40 likewise lowers from high voltage VPP to negative voltage VBB, and P-channel MOS transistor 42 is turned on so that dummy data transfer line 5 is electrically coupled to normal data transfer line 3. MOS transistors 41 and 42 are turned on complementarily to each other, and one of dummy data transfer lines 4 and 5 is isolated from normal data transfer line 3 when the other is electrically connected to normal data transfer line 3.

In the case where level converter 40 does not have a logic level converting function as shown in FIG. 12, MOS transistors 41 and 42 which correspond to MOS transistors 34 and 35 but have inverted conductivity types, respectively, are used in contrast to the structure of the switching circuit shown in FIG. 10. Thereby, switching circuit 2a having the switching characteristics similar to those of the switching circuit shown in FIG. 10 can be achieved.

Level converter 40 can be implemented by coupling nodes ND11 and ND12 to gates of MOS transistors Q25 and Q24, respectively in the structure of the level converter shown in FIG. 11.

Another level converter with an amplitude expanding function may be used.
(Third Structure of Switching Circuit)

Figure 13:
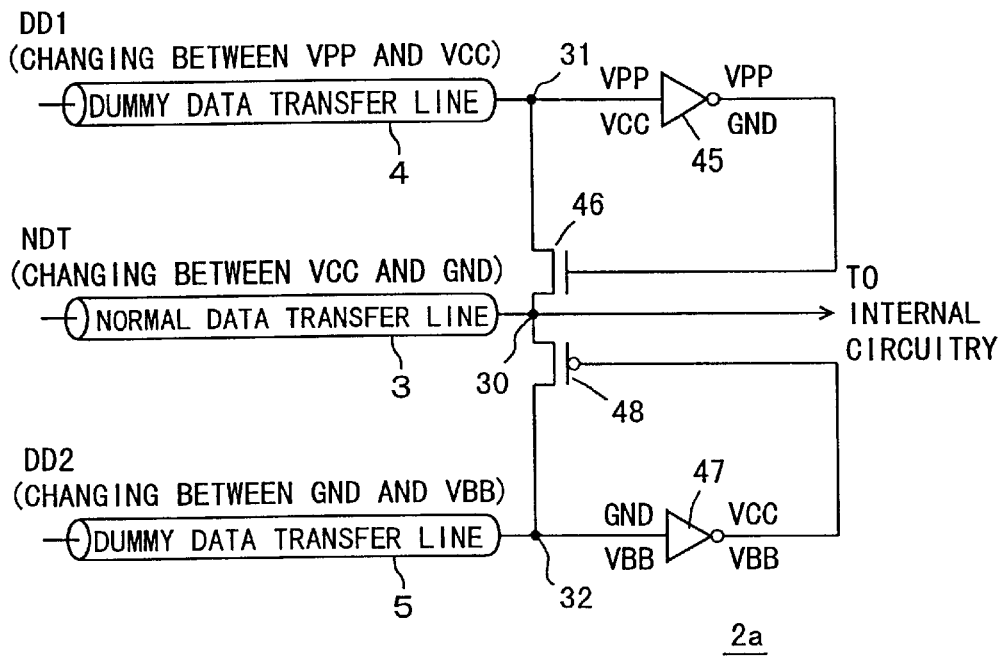
FIG. 13 shows a third structure of the switching circuit according to the fifth embodiment of the invention.

FIG. 13 shows a third structure of the switching circuit. In FIG. 13, switching circuit 2a includes: a level converter 45 which converts dummy data DD1 applied via input node 31 coupled to dummy data transfer line 4 to a signal changing between high voltage VPP and ground voltage GND, and inverts the logic level thereof; an N-channel MOS transistor 46 which electrically couples dummy data transfer line 4 to normal data transfer line 3 via input node 31 in response to the output signal of level converter 45; a level converter 47 which converts dummy data DD2 applied via input node 32 coupled to dummy data transfer line 5 to a signal changing between power supply voltage VCC and negative voltage VBB, and inverts the logic level thereof; and a P-channel MOS transistor 48 which is selectively turned on in response to the output signal of level converter 47, to electrically couple dummy data transfer line 5 to normal data transfer line 3 via input nodes 30 and 32.

Level converter 45 is achieved by utilizing a structure similar to that of final level converter 33b in level converter 33 shown in FIG. 11, and converts negative voltage VBB level to ground voltage GND level. The complementary input signal is produced by an inverter which receives high voltage VPP and power supply voltage VCC as its operation power supply voltages.

Level converter 47 can have a structure of first level converter 10a of level converter 10 shown in FIG. 7, in which, instead of high voltage VPP and ground voltage GND, power supply voltage VCC and negative voltage VBB are used. In the case where input signal IN changes between ground voltage GND and negative voltage VBB, the output signal of this initial level converter changes between power supply voltage VCC and negative voltage VBB.

When dummy data DD1 shown in FIG. 13 falls, the output signal of level converter 45 rises to H-level so that MOS transistor 46 is turned on to couple electrically dummy data transfer line 4 to normal data transfer line 3. In this case, dummy data DD2 lowers from ground voltage GND level to negative voltage VBB level, and the output signal of level converter 47 rises to power supply voltage VCC level so that MOS transistor 48 is turned off, and dummy data transfer line 5 is isolated from normal data transfer line 3.

Accordingly, when normal data NDT rises, dummy data transfer line 4 is electrically coupled to normal data transfer line 3, and occurrence of ringing is prevented. When normal data NDT falls, the voltage levels of dummy data DD1 and DD2 rise so that the output signal levels of level converters 45 and 47 fall. Responsively, MOS transistor 46 is turned off, and MOS transistor 48 is turned on so that normal data transfer line 3 is electrically coupled to dummy data transfer line 5. Even in this case, occurrence of ringing can be prevented, too.

In the structure shown in FIG. 13, normal data transfer line 3 is coupled only to switching transistors 46 and 48 so that a parasitic capacitance on input node 30 can be reduced, and fast data transfer can be achieved (because the signal changes fast).

(Fourth Structure of Switching Circuit)

Figure 14:
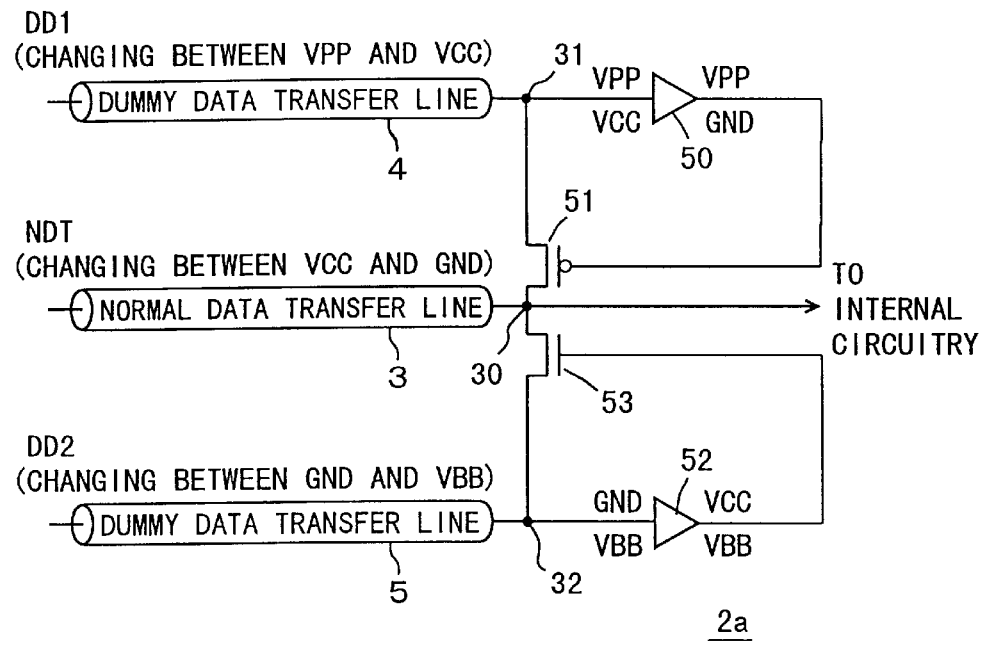
FIGS. 14 to 20 show fourth to tenth structures of the switching circuit, respectively.

FIG. 14 schematically shows a structure of a fourth structure of a switching circuit 2a. In FIG. 14, switching circuit 2a includes: a level converter 50 which receives dummy data DD1 applied via input node 31, and produces a signal changing between high voltage VPP and ground voltage GND; a P-channel MOS transistor 51 which electrically couples dummy data transfer line 4 to normal data transfer line 3 via input nodes 31 and 30 in response to the output signal of level converter 50; a level converter 52 which receives dummy data DD2 applied via input node 32, and converts it to a signal changing between power supply voltage VCC and negative voltage VBB; and an N-channel MOS transistor 53 which electrically couples dummy data transfer line 5 to normal data transfer line 3 via input nodes 30 and 31 in response to the output signal of level converter 52. Level converters 50 and 52 do not have a function of converting (inverting) the logic level, and merely have a function of expanding the amplitude. Level converters 50 and 52 can be achieved by using the already described level converter (initial level converter) which has the amplitude expanding function.

When the voltage level of normal data NDT rises, the voltage levels of dummy data DD1 and DD2 fall. In this case, the voltage levels of the output signals of level converters 50 and 52 lower, so that MOS transistor 51 is turned on and MOS transistor 53 is turned off. Normal data transfer line 3 is electrically coupled to dummy data transfer line 4, and normal data transfer line 3 is isolated from dummy data transfer line 5.

When the voltage level of normal data NDT falls, the voltage levels of dummy data DD1 and DD2 rise so that the voltage levels of the output signals of level converters 50 and 52 rise. Responsively, MOS transistor 51 is turned off, and MOS transistor 53 is turned on so that normal data transfer line 3 is electrically connected to dummy data transfer line 5, and dummy data transfer line 4 is isolated from normal data transfer line 3. Upon rising of normal data NDT, the ringing can be cancelled by using dummy data DD1. Upon falling of normal data NDT, the ringing can be cancelled by using dummy data DD2.

Switching circuit 2a shown in FIG. 14 utilizes switching circuit 2a shown in FIG. 13 as well as MOS transistors 51 and 53 same as MOS transistors 46 and 48 functioning as the switching transistors except for that the conductivity types are changed, respectively, because of lack of the logic level inverting function. Therefore, switching circuit 2a shown in FIG. 14 can achieve a function similar to switching circuit 2a shown in FIG. 13.

(Fifth Structure of Switching Circuit)

Figure 15:
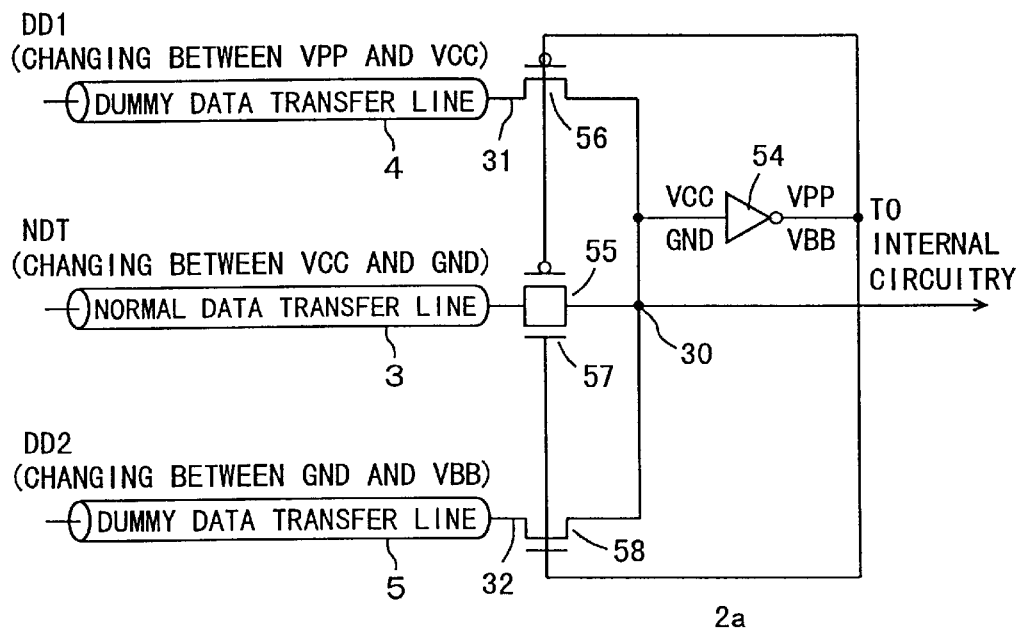

FIG. 15 shows a structure of a fifth structure of switching circuit 2a. In FIG. 15, switching circuit 2a includes: P- and N-channel MOS transistor 55 and 57 which form a CMOS transmission gate connected between normal data transfer line 3 and input node 30; a level converter 54 which converts a signal on input node 30 changing between power supply voltage VCC and ground voltage GND to a signal changing between high voltage VPP and negative voltage VBB, and inverts the logic level; a P-channel MOS transistor 56 which electrically couples dummy data transfer line 4 to input node 30 in response to output signal of level converter 54; and an N-channel MOS transistor 58 which electrically couples dummy data transfer line 5 to input node 30 in response to the output signal of level converter 54. The output signal of level converter 54 is applied to gates of P- and N-channel MOS transistors 55 and 57.

In the structure of switching circuit 2a shown in FIG. 15, when normal data NDT rises from ground voltage GND level to power supply voltage VCC level, one of P- and N-channel MOS transistors 55 and 57 forming the CMOS transmission gate is turned on. Therefore, normal data NDT is first applied via input node 30 to level converter 54 and the voltage level thereof is converted with the logic level inverted. Accordingly, the output signal of level converter 54 falls from high voltage VPP level to negative voltage VBB level. In this state, P-channel MOS transistor 56 is on, and N-channel MOS transistor 58 is off. P-channel MOS transistor 55 is on, and N-channel MOS transistor 57 is off. Accordingly, even if the input node 30 is coupled to normal data transfer line 3 via the CMOS transmission gate, the voltage level conversion and logic level inversion can be accurately performed in accordance with normal data NDT.

In the structure shown in FIG. 15, normal data transfer line 3 is connected to input node 30 via MOS transistor 55 or 57. Dummy data transfer line 4 is electrically coupled to input node 30 via MOS transistor 56, and dummy data transfer line 5 is connected to input node 30 via MOS transistor 58. When viewed from input node 30, the signal transmission characteristics for the data transfer lines connected to input node 30 can be equal to each other so that a middle value of ringing is accurately generated onto internal input node 30, and a stable waveform can be transmitted to internal circuitry.

The channel resistance (equivalent resistance) of on-state MOS transistor 56 or 58 arranged between input node 30 and dummy data transfer line 4 or 5 is equal to the equivalent resistance (channel resistance of MOS transistor 55 or 57 in the on state) of CMOS transmission gate 55 or 57 between input node 30 and normal data transfer line 3. When viewed from input node 30, the data transfer line transferring dummy data DD1 or DD2 can have the same signal transmission characteristics as the data transfer line transferring normal data NDT, and the very intermediate value of ringing can be accurately present on input node 30. In particular, more accurate and symmetrical resistance distribution can be achieved in the case where input node 30 is coupled to level converter 54, because the input resistance and input capacitance of level converter 54 are common to those signal transfer lines.

(Sixth Structure of Switching Circuit)

Figure 16:
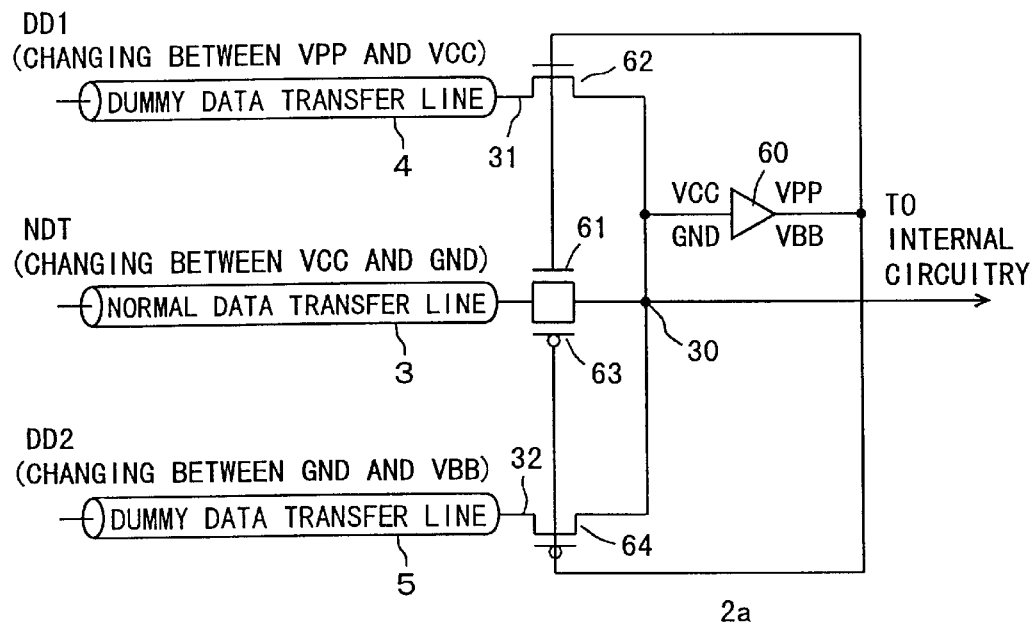

FIG. 16 shows a sixth structure of the switching circuit according to the fifth embodiment of the invention. In FIG. 16, switching circuit 2a includes: a level converter 60 which converts a signal changing between power supply voltage VCC on internal input node 30 and ground voltage GND to a signal changing between high voltage VPP and negative voltage VBB; an N-channel MOS transistor 61 which electrically couples normal data transfer line 3 to internal input node 30 in response to the output signal of level converter 60; an N-channel MOS transistor 62 which is turned on in the same phase as MOS transistor 61 in response to the output signal of level converter 60, to electrically couple dummy data transfer line 4 to internal input node 30; a P-channel MOS transistor 63 which is turned on in the opposite phase with respect to MOS transistor 61 in response to the output signal of level converter 60, to electrically couple normal data transfer line 3 to internal input node 30; and a P-channel MOS transistor 64 which is turned on in the same phase as MOS transistor 63 in response to the output signal of level converter 60 to electrically couple dummy data transfer line 5 to internal input node 30.

Level converter 60 does not have a function of inverting the logic level, and produces a signal of the same phase as the signal on internal input node 30. Internal input node 30 is electrically coupled to normal data transfer line 3 via a CMOS transmission gate formed of MOS transistors 61 and 63.

When normal data NDT rises from L-level to H-level, MOS transistor 63 changes from the on-state to the off-state, and MOS transistor 61 changes from the off-state to the on-state. When normal data NDT falls from H-level to L-level, MOS transistor 61 changes from the on-state to the off-state, and MOS transistor 63 changes from the off-state to the on-state. Accordingly, internal input node 30 is normally supplied with normal data NDT, which is applied via normal data transfer line 3, via the CMOS transmission gate formed of MOS transistors 61 and 63. MOS transistors 62 and 64 coupled to dummy data transfer lines 4 and 5 are turned on in the same phase as MOS transistors 61 and 63 each provided for the normal data transfer line, respectively. In the structure shown in FIG. 16, therefore, normal data transfer line 3 and dummy data transfer lines 4 and 5 are supplied with the data via the MOS transistors, and have the same characteristics when viewed from internal input node 30. Accordingly, a signal at the voltage level of the intermediate value of the ringing can be accurately produced on internal input node 30, and the ringing can be accurately cancelled.

(Seventh Structure of Switching Circuit)

Figure 17:
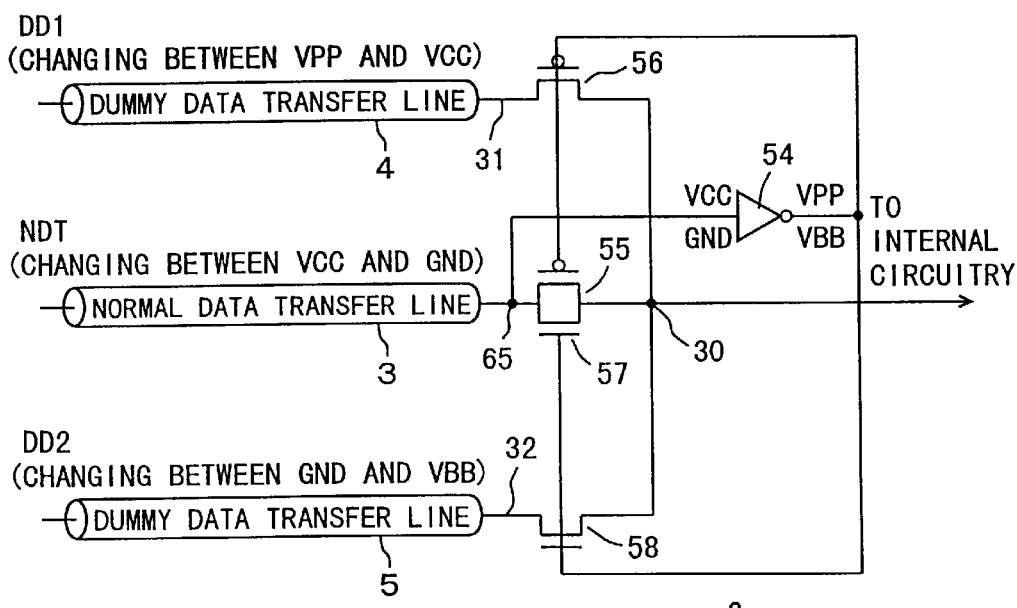

FIG. 17 shows a seventh structure of the switching circuit according to the fifth embodiment of the invention. In switching circuit 2a shown in FIG. 17, a level converter 54 having a logic level inverting function does not receive the signal on internal input node 30, but receives a signal on an input node 65 coupled to normal data transfer line 3. Structures other than the above are the same as those of the switching circuit shown in FIG. 15. Corresponding parts and portions bear the same reference numerals, and description thereof is not repeated.

In the structure shown in FIG. 17, the signal on input node 65 receiving normal data NDT is applied to level converter 54 without propagation delay though a CMOS transmission gate formed of MOS transistors 55 and 57. Therefore, dummy data transfer lines 4 or 5 can be coupled to internal input node 30 in accordance with change in normal data NDT at a faster timing, and therefore ringing can be cancelled more accurately.

(Eighth Structure of Switching Circuit)

Figure 18:
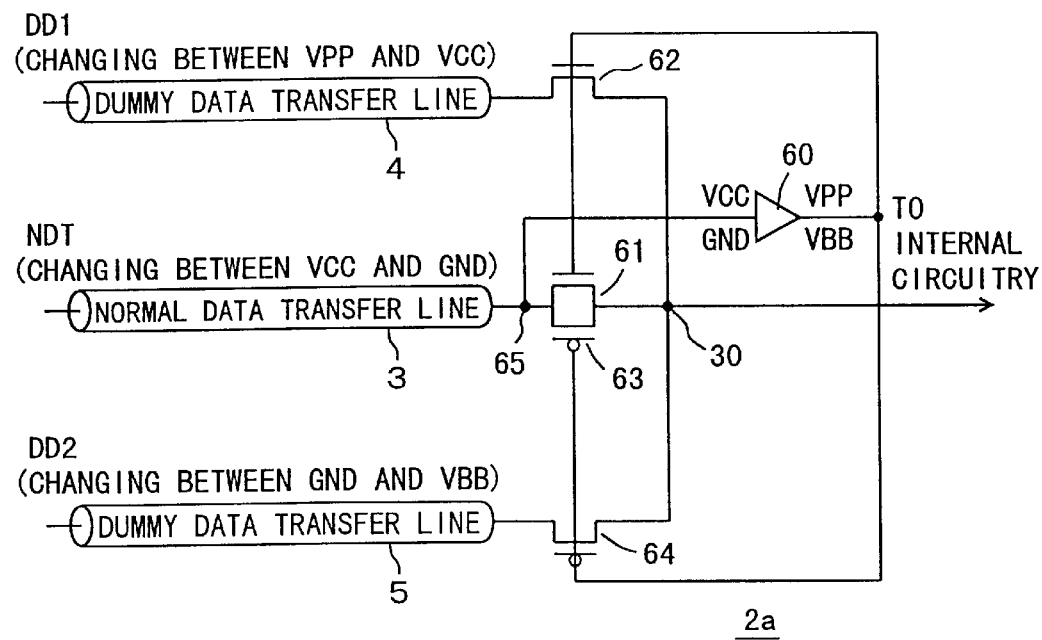

FIG. 18 shows an eighth structure of the switching circuit. The structure shown in FIG. 18 differs from the structure of the switching circuit shown in FIG. 16 in the following point. Level converter 60 receives the signal on input node 65 coupled to normal data transfer line 3. Structures other than the above are the same as those shown in FIG. 16. Corresponding parts and portions bear the same reference numerals, and description thereof is not repeated.

Switching circuit 2a shown in FIG. 18 achieves the effect similar to that by the structure shown in FIG. 16. In addition, level converter 60 receives the signal on input node 65 coupled to normal data transfer line 3, and the output signal of level converter 60 can be changed rapidly at a faster timing in accordance with change in normal data NDT, so that ringing can be canceled accurately.

(Ninth Structure of Switching Circuit)

Figure 19:
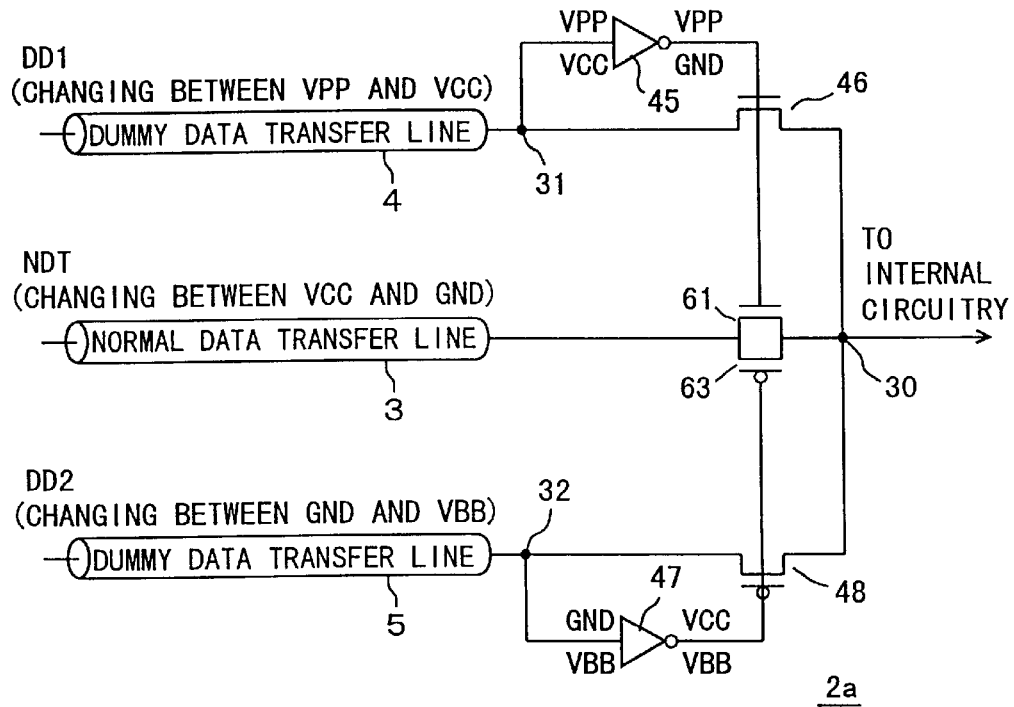

FIG. 19 shows a ninth structure of the switching circuit. Switching circuit 2a shown in FIG. 19 differs from switching circuit 2a shown in FIG. 13 in the following structure. N-channel MOS transistor 61 which is turned on in response to the output signal of level converter 45 and P-channel MOS transistor 63 which is turned on in response to the output signal of level converter 47 are arranged between normal data transfer line 3 and internal input node 30. Structures other than the above are the same as those shown in FIG. 13, and corresponding parts and portions bear the same reference numerals, and description thereof is not repeated.

In the structure of switching circuit 2a shown in FIG. 19, the electric characteristics of the two data transfer lines (normal data transfer line 3 and dummy data transfer line 4 or 5) are equal to each other when viewed from internal input node 30. Therefore, the signal at the level intermediate the levels of the dummy data and the normal data can be produced on the internal input node, so that ringing can be accurately cancelled.

(Tenth Structure of Switching Circuit)

Figure 20:
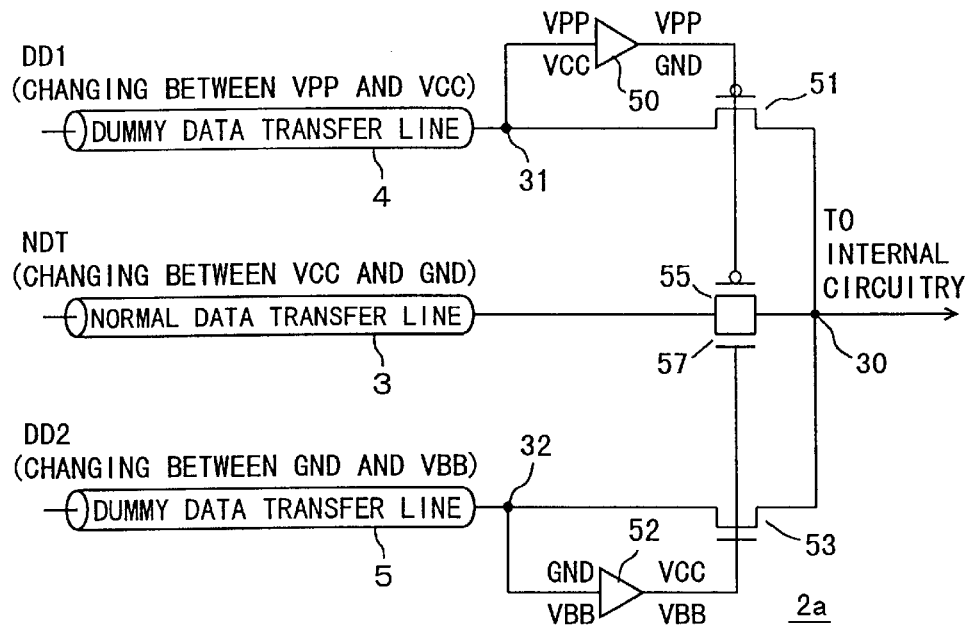
Figure 21:
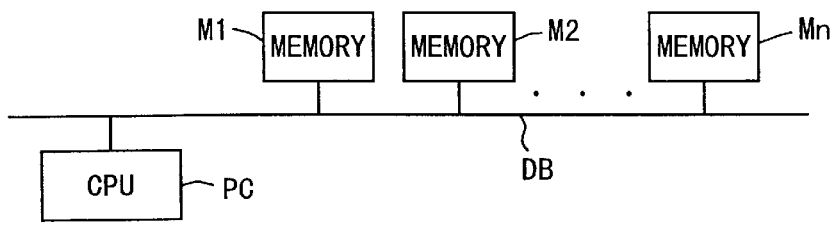
FIG. 21 schematically shows a structure of a data processing system in the prior art.

FIG. 20 shows a tenth structure of the switching circuit. The switching circuit 2a shown in FIG. 20 differs from switching circuit 2a shown in FIG. 14 in the following structure. P-channel MOS transistor 55 which is turned on in response to the output signal of level converter 50 and N-channel MOS transistor 57 which is turned on in response to the output signal of level converter 52 are arranged between normal data transfer line 3 and internal input node 30. Structures other than the above are the same as those of switching circuit 2a shown in FIG. 14, and corresponding parts and portions bear the same reference numerals, and description thereof is not repeated.

According to the structure of switching circuit 2a shown in FIG. 20, MOS transistors 51 and 55 are simultaneously turned on, and MOS transistors 57 and 53 are simultaneously turned on. In accordance with change in dummy data, dummy data transfer lines 4 and 5 are selectively coupled to internal input node 30, whereby MOS transistors 51 and 55 can be driven to the on/off state at a faster timing, and ringing can be accurately cancelled.

According to the fifth embodiment of the invention, as described above, the dummy data transfer lines are selectively coupled to the normal data transfer line in the receiving device in accordance with the logic level of the received normal data or dummy data. Therefore, ringing can be accurately cancelled with a simple structure.

(Other Examples of Application)

In the above description, the transmission signal is data, and transmission of data is performed after determining the logic level in accordance with the output enable signal. However, the semiconductor device is merely required to have a circuit structure for sending and receiving a signal, and is not restricted to the memory device. Also, it has been described that the sending device and the receiving device are independent of each other, and the data is transferred only in one direction. However, the data may be transferred via bidirectional data transfer line. Also, a signal transferred in one direction may be a clock signal defining an operation timing, a control signal, an address signal or the like.

According to the invention, as described above, a first signal line for transmitting a normal signal and a pair of dummy signal lines transmitting dummy signals, complementary to the normal signal, are arranged as a set between the first and second semiconductor devices, and the normal signal line is selectively and electrically coupled to one of the paired dummy signal lines in accordance with the logic level of the normal data signal. Thus, these signal lines can have the same signal transmission characteristics, and ringing can be easily cancelled. Accordingly, the signal can be transmitted fast, and the system capable of fast operation can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device system comprising:
   a first signal line coupled to a first semiconductor device and a second semiconductor device, for transmitting a digital signal between the first and second semiconductor devices;
   a first dummy signal line coupled to said first semiconductor device and said second semiconductor device, and having same signal transmission characteristics as said first signal line, for transmitting a first dummy signal complementary to said digital signal in a same direction as said digital signal; and
   a second dummy signal line coupled to said first semiconductor device and said second semiconductor device, and having the same signal transmission characteristics as said first signal line, for transmitting a second dummy signal complementary to said digital signal in the same direction as said digital signal, said first signal line as well as the first and second dummy signal lines being arranged forming a set.

2. The semiconductor device system according to claim 1, wherein
   a signal changing range of said first dummy signal is different in voltage level from a signal changing range of said digital signal, and a signal changing range of said second dummy signal is different in voltage level from the signal changing ranges of said digital signal and said first dummy signal.

3. The semiconductor device system according to claim 1, wherein
   at least one of said first and second semiconductor devices includes coupling circuitry for coupling said first signal line to said first dummy signal line when said digital signal changes in a first direction, and coupling said first signal line to said second dummy signal line when said digital signal changes in a second direction opposite to said first direction.

4. The semiconductor device system according to claim 3, wherein
   said coupling circuitry of said at least one of said first and second semiconductor devices includes a circuit for isolating said first signal line from said second dummy signal line when said digital signal changes in said first direction, and isolating said first signal line from said first dummy signal line when said digital signal changes in said second direction.

5. The semiconductor device system according to claim 1, wherein
   said digital signal changes between a first voltage level and a second voltage level higher than said first voltage level, said first dummy signal changes between a third voltage level higher than said second voltage level and said second voltage level, and said second dummy signal changes between a fourth voltage level lower than said first voltage and said first voltage level.

6. The semiconductor device system according to claim 1, wherein
   said at least one of said first and second semiconductor devices includes a circuit for electrically coupling the first and second dummy signal lines complementarily to said first signal line in response to the digital signal on said first signal line.

7. The semiconductor device system according to claim 1, wherein
   at least one of said first and second semiconductor devices includes a normal output circuit for generating said digital signal onto said first signal line in accordance with an internal signal, a first dummy output circuit for generating, as said first dummy signal, a signal complementary to said digital signal in response to said internal signal onto said first dummy signal line, and a second dummy output circuit for generating, as said second dummy signal, a signal complementary to said digital signal in response to said internal signal onto said second dummy signal line.

8. The semiconductor device system according to claim 7, wherein
   said digital signal and the first and second dummy signals have same amplitudes;
   said normal output circuit includes a first transistor for driving said first signal line to a first voltage level, and a second transistor for driving said first signal line to a second voltage level;
   said first dummy output circuit includes a first dummy output transistor turned on, when said first transistor is turned on, for driving said first dummy signal line in a direction opposite in signal change to said first signal line; and
   said second dummy output circuit includes a second dummy output transistor turned on, when said second transistor is turned on, for driving said second dummy signal line in a direction opposite in signal change to said first signal line, said first transistor and said first dummy transistor have equivalent resistances equal to each other, and said second transistor and said second dummy transistor have equivalent resistances equal to each other.

9. A semiconductor device comprising:

normal output circuitry for generating a digital signal onto a first signal line in accordance with an internal signal;

first dummy output circuitry for generating, as a first dummy signal, a signal complementary to said digital signal in response to said internal signal onto a first dummy signal line having a same signal transmission characteristics as said first signal line; and second dummy output circuitry for generating, as a second dummy signal, a signal complementary to said digital signal in response to said internal signal onto a second dummy signal line having the same signal transmission characteristics as said first signal line.

10. The semiconductor device according to claim 9, wherein said first dummy output circuitry includes a circuit for performing level conversion, in accordance with said internal signal, such that a signal changing range of said first dummy signal is different in voltage level from a signal changing range of said digital signal, to produce said first dummy signal; and said second dummy output circuitry includes a circuit for performing level conversion, in accordance with said internal signal, such that a signal changing range of said first dummy signal is different in voltage level from the signal changing range of said digital signal, to produce said second dummy signal.

11. The semi conductor device according to claim 9, wherein said first signal and the first and second dummy signal s are the same in amplitude;

said normal output circuitry includes a first transistor for driving said first signal line to a first voltage level, and a second transistor for driving said first signal line to a second voltage level;

said first dummy output circuitry includes a first dummy output transistor turned on, when said first transistor is turned on, for driving said first dummy signal line in a direction opposite in signal change to said first signal line; and said second dummy output circuitry includes a second dummy output transistor turned on, when s aid second transistor is turned on, for driving said second dummy signal line in a direction opposite in signal change to said first signal line, said first transistor and said first dummy transistor have equivalent resistances equal to each other, and said second transistor and said second dummy transistor have equivalent resistances equal to each other.

12. The semiconductor device according to claim 9, wherein said normal output circuitry includes a first transistor for driving said first signal line to a first voltage level, and a second transistor for driving said first signal line to a second voltage level;

said first dummy output circuitry includes a first dummy output transistor turned on, when said second transistor is on, for driving said first dummy signal line in a direction opposite in signal change to said first signal line; and said second dummy output circuitry includes a second dummy output transistor turned on, when said first transistor is on for driving said second dummy signal line in a direction opposite in signal change to said first signal line, and said first dummy output transistor and said second dummy output transistor in an on state have equivalent resistances equal to a characteristic impedance of said first signal line.

13. The semiconductor device according to claim 9, wherein said normal output circuitry includes a first transistor for driving said first signal line to a first voltage level, and a second transistor for driving said first signal line to a second voltage level;

said first dummy output circuitry includes a first dummy output transistor turned on, when said first transistor is on, for driving said first dummy signal line in a direction opposite in signal change to said first signal line; and said second dummy output circuitry includes a second dummy output transistor turned on, when said second transistor is on, for driving said second dummy signal line in a direction opposite in signal change to said first signal line;

said digital signal has a first amplitude AMB, said first dummy signal has a second amplitude AMA, said second dummy signal has a third amplitude AMC, said first signal line has a characteristic impedance Z, the first and second transistors have equivalent resistances RPB and RNB, respectively, the first and second dummy output transistors have equivalent resistances RPB and RPC, respectively, and said first and second transistors and said first and second dummy output transistors satisfy following relationship:

(i) if AMA>AMB;

$\{(Z-RPB)/(Z+RPB)\}\cdot AMB<\{(Z-RNA)/(Z+RNA)\}\cdot AMA$, and $\{(Z-RPB)/(Z+RPB)\}^2\cdot AMB>\{(Z-RNA)/(Z+RNA)\}^2\cdot AMA$ (ii) if AMA<AMB;

$\{(Z-RPB)/(Z+RPB)\}\cdot AMB>\{(Z-RNA)/(Z+RNA)\}\cdot AMA$, and $\{(Z-RPB)/(Z+RPB)\}^2\cdot AMB<\{(Z-RNA)/(Z+RNA)\}^2\cdot AMA$ (iii) if AMB>AMC;

$\{(Z-RPC)/(Z+RPC)\}\cdot AMC<\{(Z-RNB)/(Z+RNB)\}\cdot AMB$, and $\{(Z-RPC)/(Z+RPC)\}^2\cdot AMC>\{(Z-RNB)/(Z+RNB)\}^2\cdot AMB$ (iv) if AMB<AMC;

$\{(Z-RPC)/(Z+RPC)\}\cdot AMC>\{(Z-RNB)/(Z+RNB)\}\cdot AMB$, and $\{(Z-RPC)/(Z+RPC)\}^2\cdot AMC<\{(Z-RNB)/(Z+RNB)\}^2\cdot AMB$.

14. The semiconductor device according to claim 9, wherein said normal output circuitry includes a circuit for producing said digital signal in accordance with said internal signal and an output timing signal;

said first dummy output circuitry includes a first level converter for converting voltage levels of said internal signal and said output timing signal, and a circuit for producing said first dummy signal in accordance with an output signal of said first level converter; and said second dummy output circuitry includes a second level converter for converting the voltage levels of said internal signal and said output timing signal, and a circuit for producing said second dummy signal in accordance with an output signal of said second level converter.

15. The semiconductor device according to claim 9, wherein said normal output circuitry includes a producing circuit for producing an internal digital signal in accordance with said internal signal and an output timing signal, and a circuit for generating said digital signal on said first signal line in response to said internal digital signal generated from said producing circuit;

said first dummy output circuitry includes a first level converter for converting a voltage level of the internal digital signal of said producing circuit, and a circuit for generating said first dummy signal to said first dummy signal line in accordance with an output signal of said first level converter; and said second dummy output circuitry includes a second level converter for converting the voltage level of the internal digital signal of said producing circuit, and a circuit for generating said second dummy signal to said second dummy signal line in accordance with an output signal of said second level converter.

16. A semiconductor device comprising:

an input node coupled to a first signal-line transmitting a digital signal;

a first dummy input node having same signal transmission characteristics as said first signal line, and coupled to a first dummy signal line transmitting a signal complementary to the digital signal on said first signal line;

a second dummy input node having same signal transmission characteristics as said first signal line, and coupled to a second dummy signal line transmitting a signal complementary to said digital signal; and coupling circuitry coupled to said first internal node for coupling said first signal line to said first dummy signal line when said digital signal changes in a first direction, and coupling said first signal line to said second dummy signal line when said digital signal changes in a second direction opposite to said first direction.

17. The semiconductor device according to claim 16, wherein said coupling circuitry further includes a circuit coupled to said first internal node for isolating said first signal line from said second dummy signal line when said digital signal changes in said first direction, and isolating said first signal line from said first dummy signal line when said digital signal changes in the second direction opposite to said first direction.

18. The semiconductor device according to claim 16, wherein said coupling circuit includes a circuit for coupling said first signal line and said first dummy signal line via switching transistors of a first conductivity type to a second internal node coupled to input circuitry in response to said digital signal on said first input node, and coupling said first signal line and said second dummy signal line to said internal node via second switching transistors of a second conductivity type in response to said digital signal, and said first switching transistors are turned on complementarily to said second transistors.

19. The semiconductor device according to claim 16, wherein said digital signal changes between a first voltage level and a second voltage level, said first dummy signal changes between said second voltage level and a third voltage level higher than said second voltage, and said second dummy signal changes between said first voltage level and a fourth voltage level lower than said first voltage level; and said coupling circuitry includes:
a level converting circuit for level-converting said digital signal on said first input node to a signal changing between the third and fourth voltage levels,
a first coupling transistor for electrically coupling said first dummy signal line to said first signal line in response to an output signal of said level converting circuit, and
a second coupling transistor turned on complementarily to said first coupling transistor in response to the output signal of said level converting circuit for electrically coupling said first signal line to said second dummy signal line.

20. The semiconductor device according to claim 16, wherein said digital signal changes between a first voltage level and a second voltage level higher than said second voltage level, said first dummy signal changes between said second voltage level and a third voltage level higher than said second voltage, and said second dummy signal changes between said first voltage level and a fourth voltage level lower than said first voltage level; and said coupling circuitry includes:
a first level converter for converting said first dummy signal to a signal changing between the first and third voltage levels in response to said first dummy signal on said first input node;
a first coupling element for electrically coupling said first dummy signal line to said first signal line in response to an output signal of said first level converter;
a second level converter for converting said second dummy signal to a signal changing between the second and fourth voltage levels, and
a second coupling element turned on complementarily to said first coupling element in response to an output signal of said second level converter for electrically coupling said second dummy signal line to said first signal line.

* * * * *